US012704965B2

(12) United States Patent
Zhu et al.

(10) Patent No.: US 12,704,965 B2
(45) Date of Patent: Aug. 11, 2026

(54) ESTABLISHING MEMORY SYSTEM READ WINDOW BUDGET

(71) Applicant: Micron Technology, Inc., Boise, ID (US)

(72) Inventors: Jianying Zhu, Shanghai (CN); Huan Deng, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 19/052,022

(22) Filed: Feb. 12, 2025

(65) Prior Publication Data

US 2025/0284402 A1 Sep. 11, 2025

Related U.S. Application Data

(60) Provisional application No. 63/561,857, filed on Mar. 6, 2024.

(51) Int. Cl.
*G06F 3/06* (2006.01)
*G11C 16/26* (2006.01)
*G11C 16/04* (2006.01)

(52) U.S. Cl.
CPC .......... *G06F 3/0613* (2013.01); *G06F 3/0656* (2013.01); *G06F 3/0659* (2013.01); *G06F 3/0679* (2013.01); *G11C 16/26* (2013.01); *G11C 16/0483* (2013.01)

(58) Field of Classification Search
CPC .... G06F 3/0613; G06F 3/0656; G06F 3/0659; G06F 3/0679; G11C 16/26; G11C 16/0483; G11C 11/5642
See application file for complete search history.

(56) References Cited

U.S. PATENT DOCUMENTS 10,242,747 B1 * 3/2019 Patel ...................... G11C 16/08
10,991,444 B1 * 4/2021 Bazarsky ............... G11C 29/42
2024/0184468 A1 * 6/2024 Cao ....................... G06F 3/0604

* cited by examiner

*Primary Examiner* — Tasnima Matin
(74) *Attorney, Agent, or Firm* — Holland & Hart LLP

(57) ABSTRACT

Methods, systems, and devices for establishing memory system read window budget (RWB) are described. A memory system may receive a command from a host system requesting an RWB for an edge of a distribution of a logic level of a set of logic levels. The memory system may determine an expected pattern of data corresponding to a set of memory cells and may store the expected pattern in memory. The memory system may perform a voltage sweep operation, including setting a read voltage to different levels across the edge for reading the set of memory cells. The memory system may count a quantity of expected bits resulting from a logic function of the expected pattern and the read data for each level, and may output a voltage offset corresponding to level at which a difference of the quantity of expected bits and an initial quantity satisfies a threshold.

20 Claims, 11 Drawing Sheets

| A | B | A OR B |
|---|---|---|
| 0 | 0 | 0 |
| 0 | 1 | 1 |
| 1 | 0 | 1 |
| 1 | 1 | 1 |

700

800

Figure 10:
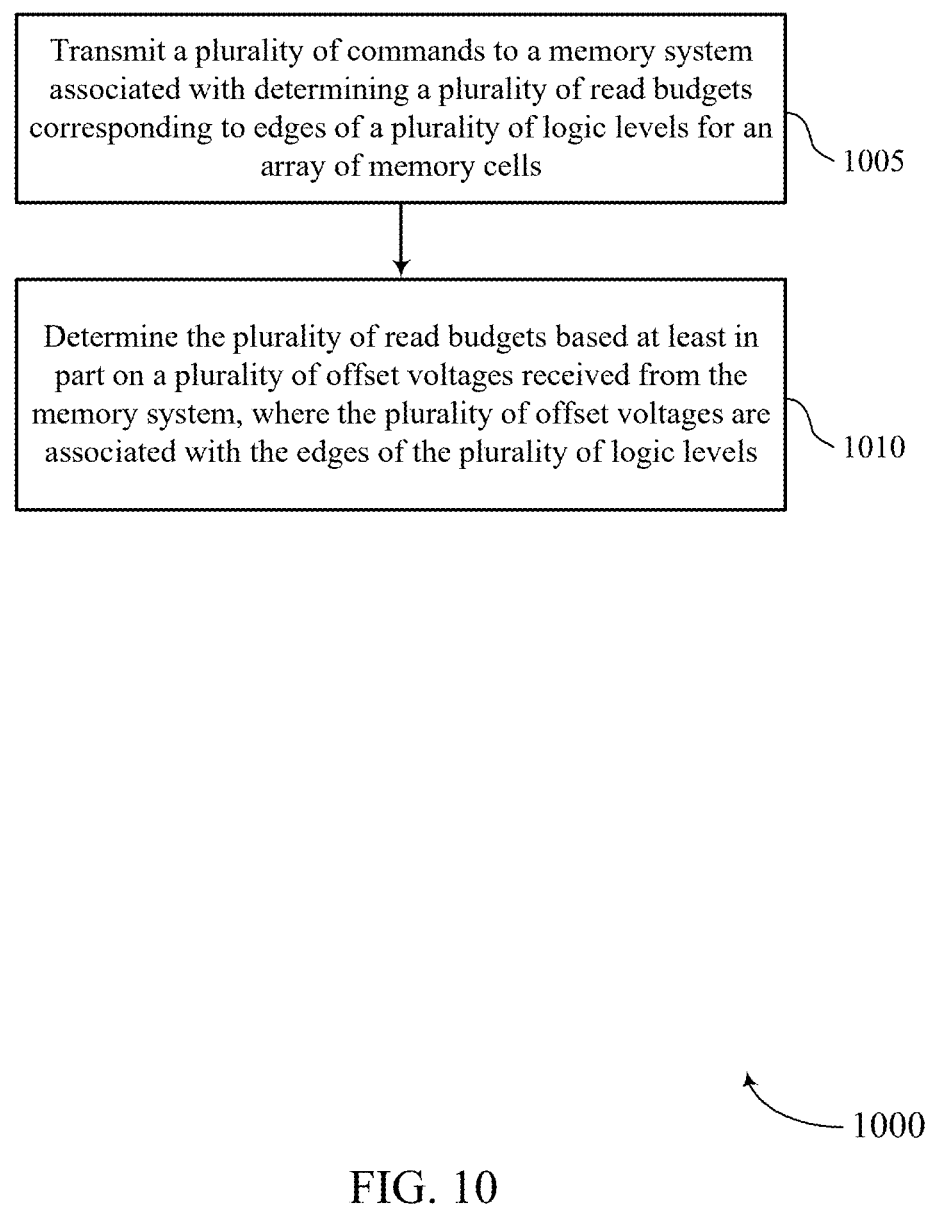

Transmit a plurality of commands to a memory system associated with determining a plurality of read budgets corresponding to edges of a plurality of logic levels for an array of memory cells

1005

Determine the plurality of read budgets based at least in part on a plurality of offset voltages received from the memory system, where the plurality of offset voltages are associated with the edges of the plurality of logic levels

Figure 11:
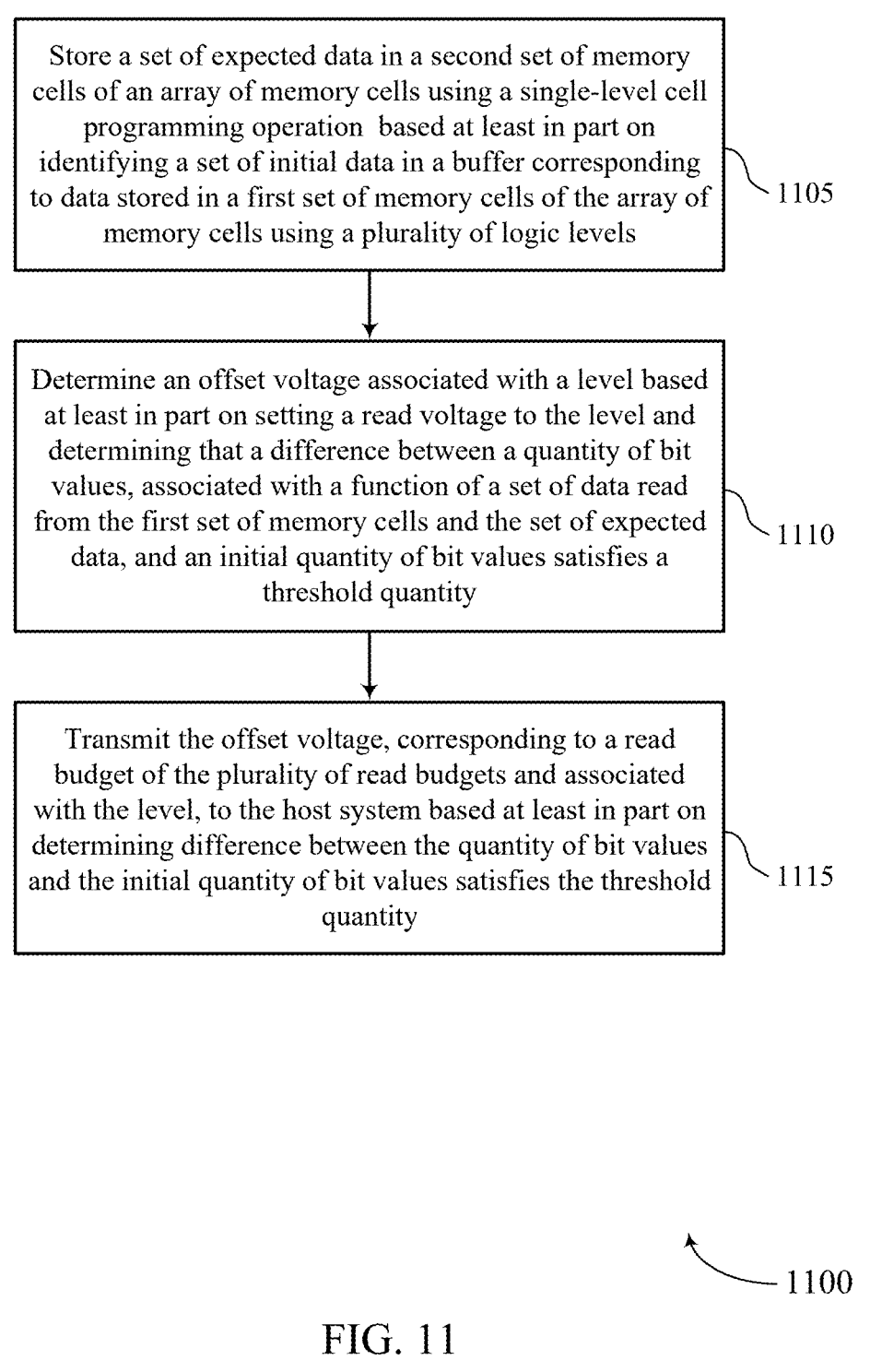

Store a set of expected data in a second set of memory cells of an array of memory cells using a single-level cell programming operation based at least in part on identifying a set of initial data in a buffer corresponding to data stored in a first set of memory cells of the array of memory cells using a plurality of logic levels

1105

Determine an offset voltage associated with a level based at least in part on setting a read voltage to the level and determining that a difference between a quantity of bit values, associated with a function of a set of data read from the first set of memory cells and the set of expected data, and an initial quantity of bit values satisfies a threshold quantity

1110

Transmit the offset voltage, corresponding to a read budget of the plurality of read budgets and associated with the level, to the host system based at least in part on determining difference between the quantity of bit values and the initial quantity of bit values satisfies the threshold quantity

ESTABLISHING MEMORY SYSTEM READ WINDOW BUDGET

CROSS REFERENCE

The present Application for Patent claims priority to U.S. Patent Application No. 63/561,857 by Zhu et al., entitled "ESTABLISHING MEMORY SYSTEM READ WINDOW BUDGET," filed Mar. 6, 2024, which is assigned to the assignee hereof, and which is expressly incorporated by reference in its entirety herein.

TECHNICAL FIELD

The following relates to one or more systems for memory, including establishing memory system read window budget (RWB).

BACKGROUND

Memory devices are widely used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, the memory device may read (e.g., sense, detect, retrieve, determine) states from the memory cells. To store information, the memory device may write (e.g., program, set, assign) states to the memory cells.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 9 through 11 show flowcharts illustrating a method or methods that support establishing memory system RWB in accordance with examples as disclosed herein.

DETAILED DESCRIPTION

Figure 1:
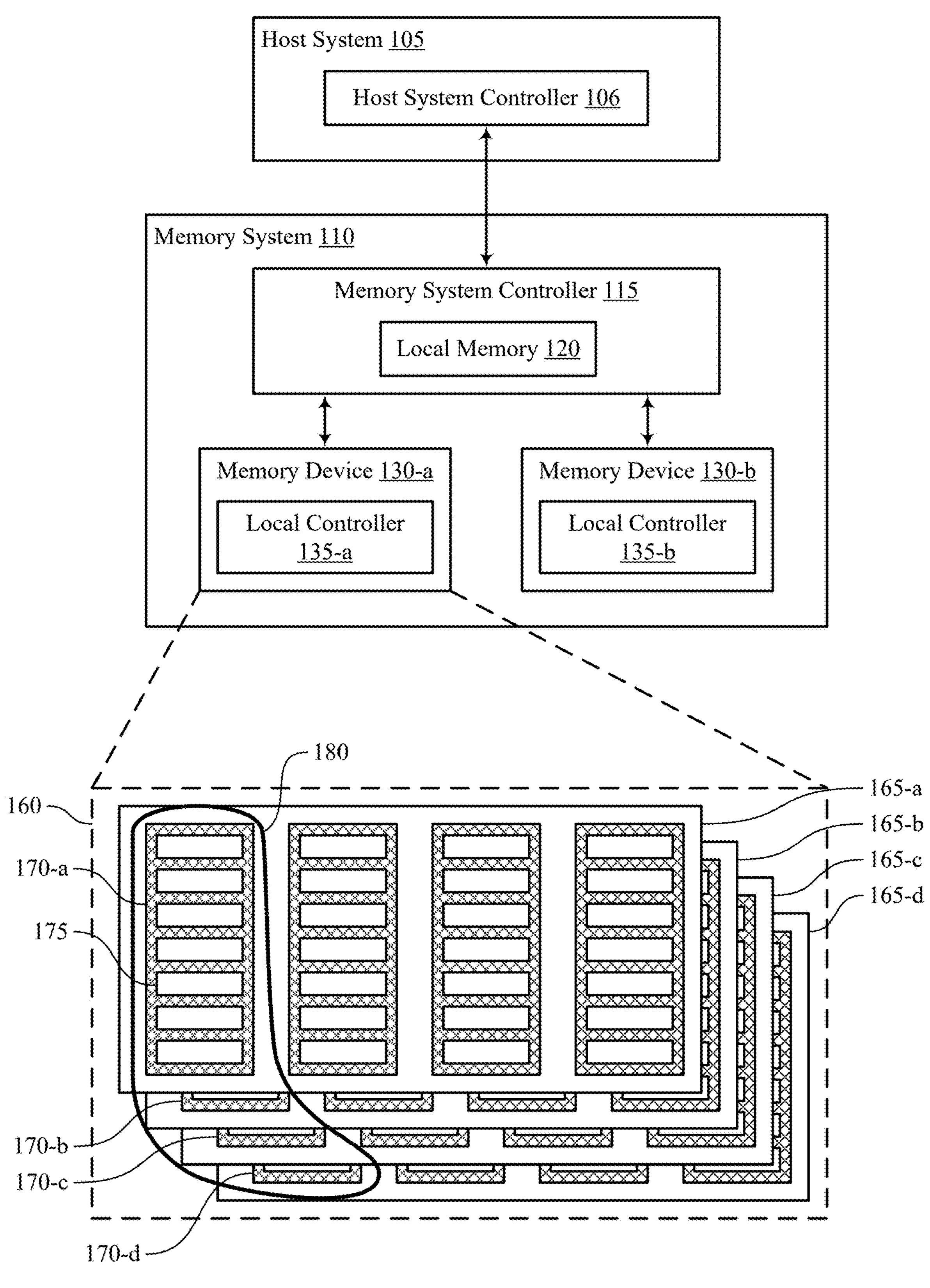
FIG. 1 shows an example of a system that supports establishing memory system read window budget (RWB) in accordance with examples as disclosed herein.

A memory system may support storing bits to memory cells according to different storage densities. For example, a memory system may support single-cell level (SLC) write operations to store a bit of information using one of two logic levels (e.g., 0 or 1) or multiple-level cell (MLC) write operations to store multiple bits of information using a greater quantity of logic levels. In some examples, a read window budget (RWB) for the memory cells may be defined as a distance from a point on an edge of a distribution of a given logic level to a next read voltage level between that edge and another logic level distribution. RWBs of memory cells may be used in some cases to improve performance of one or more memory cells. For example, an RWB may indicate a stage between beginning-of-life (BOL) and end-of-life (EOL) and associated program-erase cycle (PEC) count, data retention rate, and programming speed, among other characteristics. Some not-and (NAND) systems however, such as managed NAND (mNAND) systems, may lack robust, convenient, or reliable methods for detecting or calculating RWB in memory cells.

As described herein, RWB in NAND (e.g., mNAND) and other memory may be measured by using expected data patterns to measure each edge of a logic level distribution for logic levels of memory cells. For example, a memory system may determine an expected pattern of data (e.g., a set of expected data) stored in one or more TLC blocks and may store the expected pattern to SLC memory. The memory system may set a read voltage for reading the same TLC blocks to different levels as part of a voltage sweep operation across a given edge. For each level, the memory system may count a quantity of expected bits (e.g., for a LP/UP/XP bit that would flip over that edge) counted in both the expected and currently read data after using a logic operation to filter out such bits. The memory system may determine a quantity of flipped bits as a difference between a current bit count and an initial bit count made at a starting level, and once the quantity of flipped bits equals a threshold (e.g., a bit flip threshold), the memory system may output the current voltage level which may correspond to the RWB for that edge. In some examples, the memory system may determine an RWB for each edge as requested by commands from a host system, and may set one or more other read voltages to different levels to reduce noise during operations. Determining RWBs using such a voltage sweep operation may allow memory systems to improve performance, including increasing a quantity of PEC cycles, extending data retention time, performing full cross temperature swing, and increasing programming speed.

In addition to applicability in memory systems as described herein, techniques for establishing memory system RWB may be generally implemented to improve the performance of various electronic devices and systems (including artificial intelligence (AI) applications, augmented reality (AR) applications, virtual reality (VR) applications, and gaming). Some electronic device applications, including high-performance applications such as AI, AR, VR, and gaming, may be associated with relatively high processing requirements to satisfy user expectations. As such, increasing processing capabilities of the electronic devices by decreasing response times, improving power consumption, reducing complexity, increasing data throughput or access speeds, decreasing communication times, or increasing memory capacity or density, among other performance indicators, may improve user experience or appeal. Implementing the techniques described herein may improve the performance of electronic devices by enabling characterization of RWB for logic level edges of one or more memory cells, which may increase a programming speed, memory capacity, and data retention time of memory cells of the devices, among other benefits.

Features of the disclosure are illustrated and described in the context of systems, devices, and circuits. Features of the disclosure are further illustrated and described in the context of logic level diagrams, systems, and flowcharts.

FIG. 1 shows an example of a system 100 that supports establishing memory system read window budget in accordance with examples as disclosed herein. The system 100 includes a host system 105 coupled with a memory system 110. The system 100 may be included in a computing device such as a desktop computer, a laptop computer, a network server, a mobile device, a vehicle, an Internet of Things (IoT) enabled device, an embedded computer (e.g., one included in a vehicle, industrial equipment, or a networked commercial device), or any other computing device that includes memory and a processing device.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other devices.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally, or alternatively, include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on the same die, within the same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a die 160 (e.g., a memory die). For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as SLCs. Additionally, or alternatively, a NAND memory device 130 may include memory cells configured to each store multiple bits of information, which may be referred to as MLCs if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170 and, in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in the same page 175 may share (e.g., be coupled with) a common word line, and memory cells in the same string may share (e.g., be coupled with) a common digit line (which may alternatively be referred to as a bit line).

For some NAND architectures, memory cells may be read and programmed (e.g., written) at a first level of granularity (e.g., at a page level of granularity, or portion thereof) but may be erased at a second level of granularity (e.g., at a block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased. In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is an mNAND system.

The system 100 may include any quantity of non-transitory computer readable media that support establishing memory system read window budget. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

In some examples, the system 100 may support operations to determine an RWB in NAND (e.g., mNAND) and other memory by using expected data patterns to measure each edge of a logic level distribution for logic levels of memory cells. For example, the memory system 110 may determine an expected pattern of data (e.g., a set of expected data) stored in one or more TLC blocks (e.g., including memory cells of one or more pages 175, one or more virtual blocks 180) and may store the expected pattern to SLC memory. The memory system 110 may set a read voltage for reading the same TLC blocks to different levels as part of a voltage sweep operation across a given edge. For each level, the memory system 110 may count a quantity of expected bits (e.g., for a LP/UP/XP bit that would flip over that edge) counted in both the expected and currently read data and may determine a quantity of flipped bits as a difference between a current bit count and an initial bit count made at a starting level. Once the quantity of flipped bits equals a threshold, the memory system 110 may output the current voltage level to the host system 105, which may correspond to the RWB for that edge.

Figure 2:
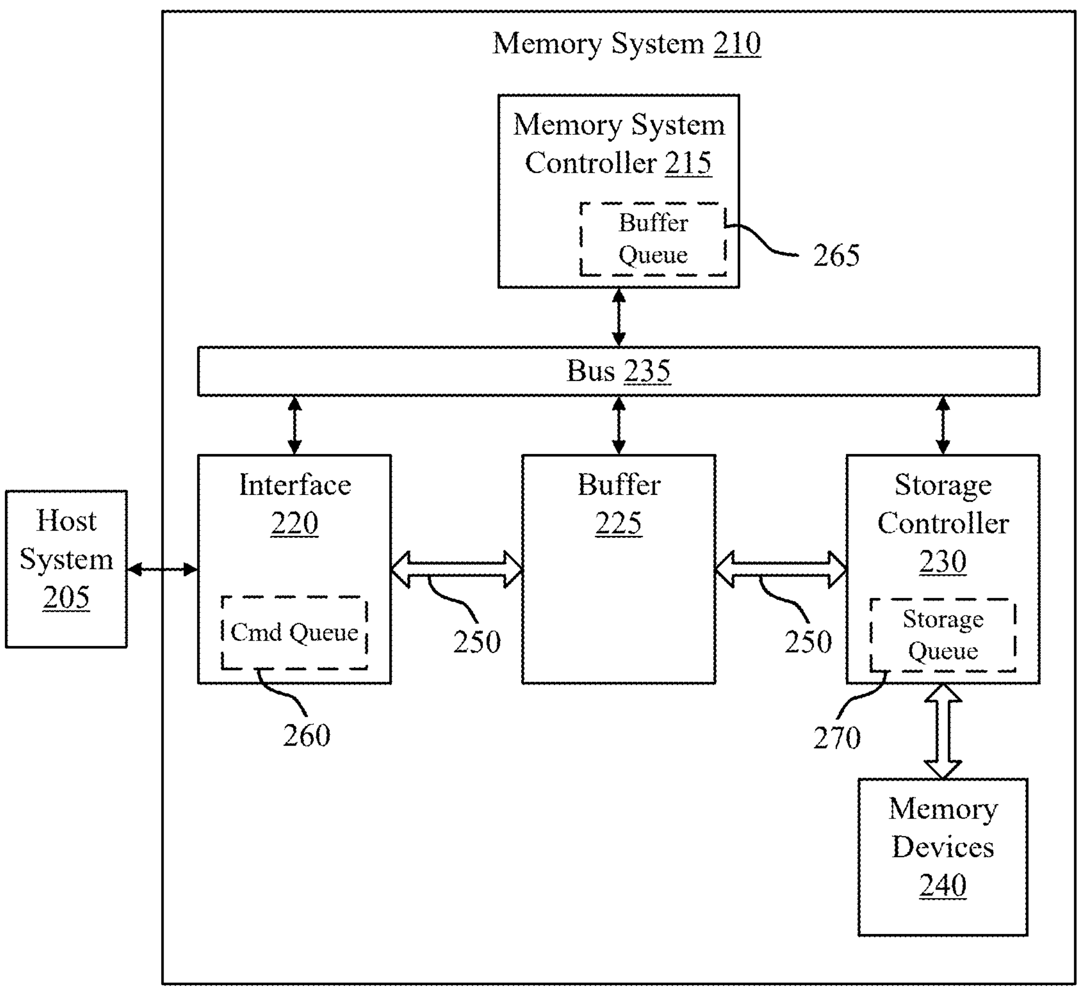
FIG. 2 shows an example of a system that supports establishing memory system RWB in accordance with examples as disclosed herein.

FIG. 2 shows an example of a system 200 that supports establishing memory system read window budget in accordance with examples as disclosed herein. The system 200 may be an example of a system 100 as described with reference to FIG. 1, or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include one or more memory devices 240 to store data transferred between the memory system 210 and the host system 205 (e.g., in response to receiving access commands from the host system 205). The memory devices 240 may include one or more memory devices as described with reference to FIG. 1. For example, the memory devices 240 may include NAND memory, PCM, self-selecting memory, 3D cross point or other chalcogenide-based memories, FERAM, MRAM, NOR (e.g., NOR flash) memory, STT-MRAM, CBRAM, RRAM, or OxRAM, among other examples.

The memory system 210 may include a storage controller 230 for controlling the passing of data directly to and from the memory devices 240 (e.g., for storing data, for retrieving data, for determining memory locations in which to store data and from which to retrieve data). The storage controller 230 may communicate with memory devices 240 directly or via a bus (not shown), which may include using a protocol specific to each type of memory device 240. In some cases, a single storage controller 230 may be used to control multiple memory devices 240 of the same or different types. In some cases, the memory system 210 may include multiple storage controllers 230 (e.g., a different storage controller 230 for each type of memory device 240). In some cases, a storage controller 230 may implement aspects of a local controller 135 as described with reference to FIG. 1.

The memory system 210 may include an interface 220 for communication with the host system 205, and a buffer 225 for temporary storage of data being transferred between the host system 205 and the memory devices 240. The interface 220, buffer 225, and storage controller 230 may support translating data between the host system 205 and the memory devices 240 (e.g., as shown by a data path 250), and may be collectively referred to as data path components.

Using the buffer 225 to temporarily store data during transfers may allow data to be buffered while commands are being processed, which may reduce latency between commands and may support arbitrary data sizes associated with commands. This may also allow bursts of commands to be handled, and the buffered data may be stored, or transmitted, or both (e.g., after a burst has stopped). The buffer 225 may include relatively fast memory (e.g., some types of volatile memory, such as SRAM or DRAM), or hardware accelerators, or both to allow fast storage and retrieval of data to and from the buffer 225. The buffer 225 may include data path switching components for bi-directional data transfer between the buffer 225 and other components.

A temporary storage of data within a buffer 225 may refer to the storage of data in the buffer 225 during the execution of access commands. For example, after completion of an access command, the associated data may no longer be maintained in the buffer 225 (e.g., may be overwritten with data for additional access commands). In some examples, the buffer 225 may be a non-cache buffer. For example, data may not be read directly from the buffer 225 by the host system 205. In some examples, read commands may be added to a queue without an operation to match the address to addresses already in the buffer 225 (e.g., without a cache address match or lookup operation).

The memory system 210 also may include a memory system controller 215 for executing the commands received from the host system 205, which may include controlling the data path components for the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, a storage queue 270) may be used to control the processing of access commands and the movement of corresponding data. This may be beneficial, for example, if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if implemented, may be positioned anywhere within the memory system 210.

Data transferred between the host system 205 and the memory devices 240 may be conveyed along a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220 (e.g., according to a protocol, such as a UFS protocol or an eMMC protocol). Thus, the interface 220 may be considered a front end of the memory system 210. After receipt of each access command, the interface 220 may communicate the command to the memory system controller 215 (e.g., via the bus 235). In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved (e.g., by the memory system controller 215). In some cases, the memory system controller 215 may cause the interface 220 (e.g., via the bus 235) to remove the command from the command queue 260.

After a determination that an access command has been received, the memory system controller 215 may execute the access command. For a read command, this may include obtaining data from one or more memory devices 240 and transmitting the data to the host system 205. For a write command, this may include receiving data from the host system 205 and moving the data to one or more memory devices 240. In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may determine if the buffer 225 has sufficient available space to store the data associated with the command. For example, the memory system controller 215 may determine (e.g., via firmware, via controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. For example, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), which may be performed in accordance with a protocol (e.g., a UFS protocol, an eMMC protocol). As the interface 220 receives the data associated with the write command from the host system 205, the interface 220 may transfer the data to the buffer 225 for temporary storage using the data path 250. In some cases, the interface 220 may obtain (e.g., from the buffer 225, from the buffer queue 265) the location within the buffer 225 to store the data. The interface 220 may indicate to the memory system controller 215 (e.g., via the bus 235) if the data transfer to the buffer 225 has been completed.

After the write data has been stored in the buffer 225 by the interface 220, the data may be transferred out of the buffer 225 and stored in a memory device 240, which may involve operations of the storage controller 230. For example, the memory system controller 215 may cause the storage controller 230 to retrieve the data from the buffer 225 using the data path 250 and transfer the data to a memory device 240. The storage controller 230 may be considered a back end of the memory system 210. The storage controller 230 may indicate to the memory system controller 215 (e.g., via the bus 235) that the data transfer to one or more memory devices 240 has been completed.

In some cases, a storage queue 270 may support a transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain (e.g., from the buffer 225, from the buffer queue 265, from the storage queue 270) the location within the buffer 225 from which to obtain the data. The storage controller 230 may manage the locations within the memory devices 240 to store the data (e.g., performing wear-leveling, performing garbage collection). The entries may be added to the storage queue 270 (e.g., by the memory system controller 215). The entries may be removed from the storage queue 270 (e.g., by the storage controller 230, by the memory system controller 215) after completion of the transfer of the data.

To process a read command received from the host system 205, the memory system controller 215 may determine if the buffer 225 has sufficient available space to store the data associated with the command. For example, the memory system controller 215 may determine (e.g., via firmware, via controller firmware), an amount of space within the buffer 225 that may be available to store data associated with the read command.

In some cases, the buffer queue 265 may support buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215 (e.g., via the bus 235) when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain (e.g., from the buffer 225, from the storage queue 270) the location within one or more memory devices 240 from which to retrieve the data. In some cases, the storage controller 230 may obtain (e.g., from the buffer queue 265) the location within the buffer 225 to store the data. In some cases, the storage controller 230 may obtain (e.g., from the storage queue 270) the location within the buffer 225 to store the data. In some cases, the memory system controller 215 may move the command processed by the storage queue 270 back to the command queue 260.

After the data has been stored in the buffer 225 by the storage controller 230, the data may be transferred from the buffer 225 and sent to the host system 205. For example, the memory system controller 215 may cause the interface 220 to retrieve the data from the buffer 225 using the data path 250 and transmit the data to the host system 205 (e.g., according to a protocol, such as a UFS protocol or an eMMC protocol). For example, the interface 220 may process the command from the command queue 260 and may indicate to the memory system controller 215 (e.g., via the bus 235) that the data transmission to the host system 205 has been completed.

The memory system controller 215 may execute received commands according to an order (e.g., a first-in-first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265 (e.g., by the memory system controller 215) if the processing of the command has been completed (e.g., if data corresponding to the access command has been transferred out of the buffer 225). If a command is removed from the buffer queue 265, the address previously storing the data associated with that command may be available to store data associated with a new command.

In some examples, the memory system controller 215 may be configured for operations associated with one or more memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. For example, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

In some examples, the system 200 may support operations to determine an RWB in NAND (e.g., mNAND) and other memory as described herein. For example, the memory system 210 may determine an expected pattern of data (e.g., a set of expected data) stored in one or more TLC blocks of one or more memory devices 240, and may store the expected pattern to SLC memory (e.g., in memory devices 240 or the buffer 225). The memory system 210 may set a read voltage for reading the same TLC blocks to different levels as part of a voltage sweep operation across a given edge. For each level, the memory system 210 may count a quantity of expected bits and may determine a quantity of flipped bits as a difference between a current bit count and an initial bit count made at a starting level. Once the quantity of flipped bits equals a threshold, the memory system 210 may output the current voltage level (e.g., RWB) to the host system 205.

Figure 3:
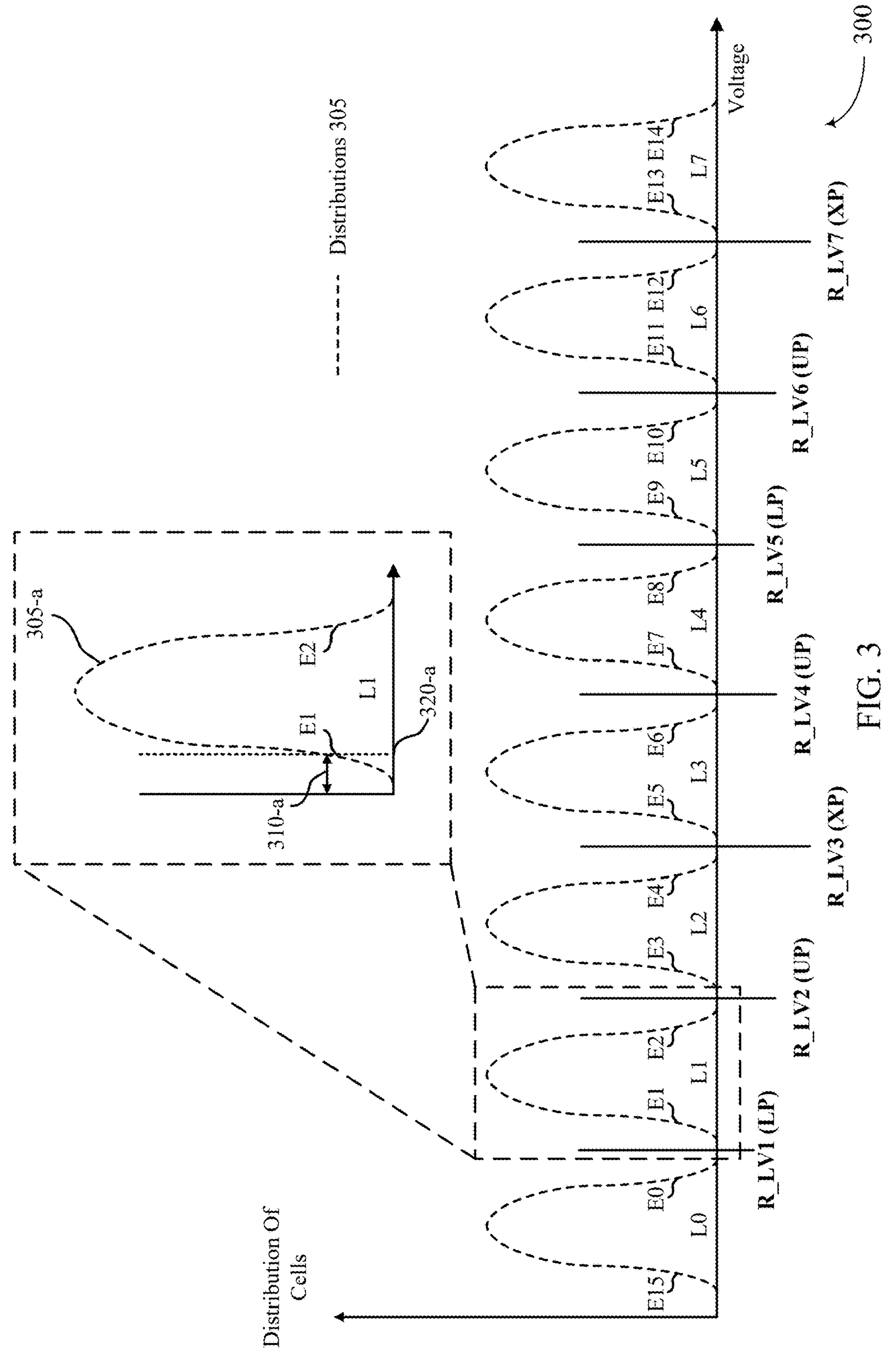
FIG. 3 shows an example of a logic level diagram that supports establishing memory system RWB in accordance with examples as disclosed herein.

FIG. 3 shows an example of a logic level diagram 300 that supports establishing memory system RWB in accordance with examples as disclosed herein. For example, the logic level diagram 300 may define a quantity of logic levels L corresponding to an MLC operation supported by memory cells of the memory system 210 as voltage increases (going right on the diagram). In some examples, the memory cells may support TLC programming operations and may include logic levels L0, L1, L2, L3, L4, L5, L6, and L7. Each logic level L may further be defined to be above an associated read level R_LV, where read levels R_LV1, R_LV2, R_LV3, R_LV4, R_LV5, R_LV6, and R_LV7 may correspond to logic levels L1-L7, respectively. L0 may be further defined as being below R_LV1. In some cases, the logic level diagram 300 may support establishing memory system RWB. In some examples, the read levels R_LV may represent threshold voltages Vi defining each level L.

The logic level diagram 300 may illustrate corresponding distributions 305 for each of the logic levels L. Notably, the dashed lines representing distributions 305 may increase vertically in the diagram to illustrate an increased quantity of memory cells corresponding to a respective voltage (e.g., for a random set of data) and may correspond to a higher likelihood of memory cells at each voltage level. Each of the distributions 305 may be associated with two respective edges E. For example, the logic level L1 may be associated with an edge E1 and an edge E2 of a distribution 305-*a*. Similarly, the logic levels L2-L7 may include edges E3 and E4, E5 and E6, E7 and E8, E9 and E10, E11 and E12, and E13 and E14, respectively. L0 may further include an edge E15. In some cases, a total of 15 edges E0 through E14 may be tracked by the memory system 210. The logic levels L1-L7 may also correspond to different bit patterns, including gray codes. For example, the logic levels L1-L7 may each correspond to a three bit value for TLC memory, each including an LP bit, a UP bit, and an XP bit in the order of [XP, UP, LP]. For a 2-3-2 grey code, the logic levels L1-L7 may correspond to the values '111', '110', '100', '000', '010', '011', '001', '101,' respectively (e.g., for one pass program replacement-gate (RG) NAND).

The logic level diagram 300 may also illustrate RWBs 310 corresponding to each edge E of the logic levels L. For example, an RWB 310-*a* for the edge E1 may extend from a closest read level R_LV1 to a point on the edge E1 at a voltage level 320-*a* and may represent an available margin or budget. In some cases, the RWB 310-*a* may be a delta offset (DAC) between a point at which a read voltage would be uncorrectable for the logic level L1 and the actual read voltage R_LV1 associated with that logic level. RWB data may be calculated for different types of memory, including in NAND component qualification (e.g., Qual) and may indicate an overall impact of a changed aspect in a memory system and an overall quality or health of one or more memory cells. For example, as the RWB 310-*a* increases (e.g., distribution 305-*a* becomes narrower), the RWB 310-*a* may indicate a greater amount of available (e.g., achievable) PEC cycles, a greater data retention time, a faster programming speed, etc. As RWB 310-*a* decreases, PEC cycles, data retention, and programming speed may decrease. Some memory systems however may not include one or more systems to collect or analyze RWB and to build an RWB database. For example, some mNAND systems may support system error recovery statistic (ERS) calculation/measurement (e.g., ability to recover after detecting errors) for a page range and one or more conditions (e.g., post bake process, at BOL data retention readout, at EOL part full range xtemp readout). Although ERS may in some cases correlate with NAND trigger rate (TR), ERS may not indicate a NAND margin remaining for RWB. mNAND systems may also support measuring or calculating threshold voltage $V_t$ (e.g., without an expected pattern) for logic levels (e.g., used for NAND defect electrical failure analysis (EFA)), which may generally indicate a level of overlap between logic level distributions, but may not indicate a more exact edge margin.

As described herein, a memory system may implement a voltage sweep operation to determine RWB for the edges E0-E14 of the logic levels L1-L7 (described with further detail in FIGS. 4-6B). Such RWB methods may enable different performance improvements to memory, including achieving a greater quantity of PEC cycles, increasing survival for more data retention time, performing full cross temperature swing, and increase a TRIM operation program time (e.g., tprog). Further, performance improvements may include applications to window re-ratio in qualification checks, improvements made during design of experiment (DOE) performance tuning and studying, and use for partial block performance tuning and studying.

Figure 4:
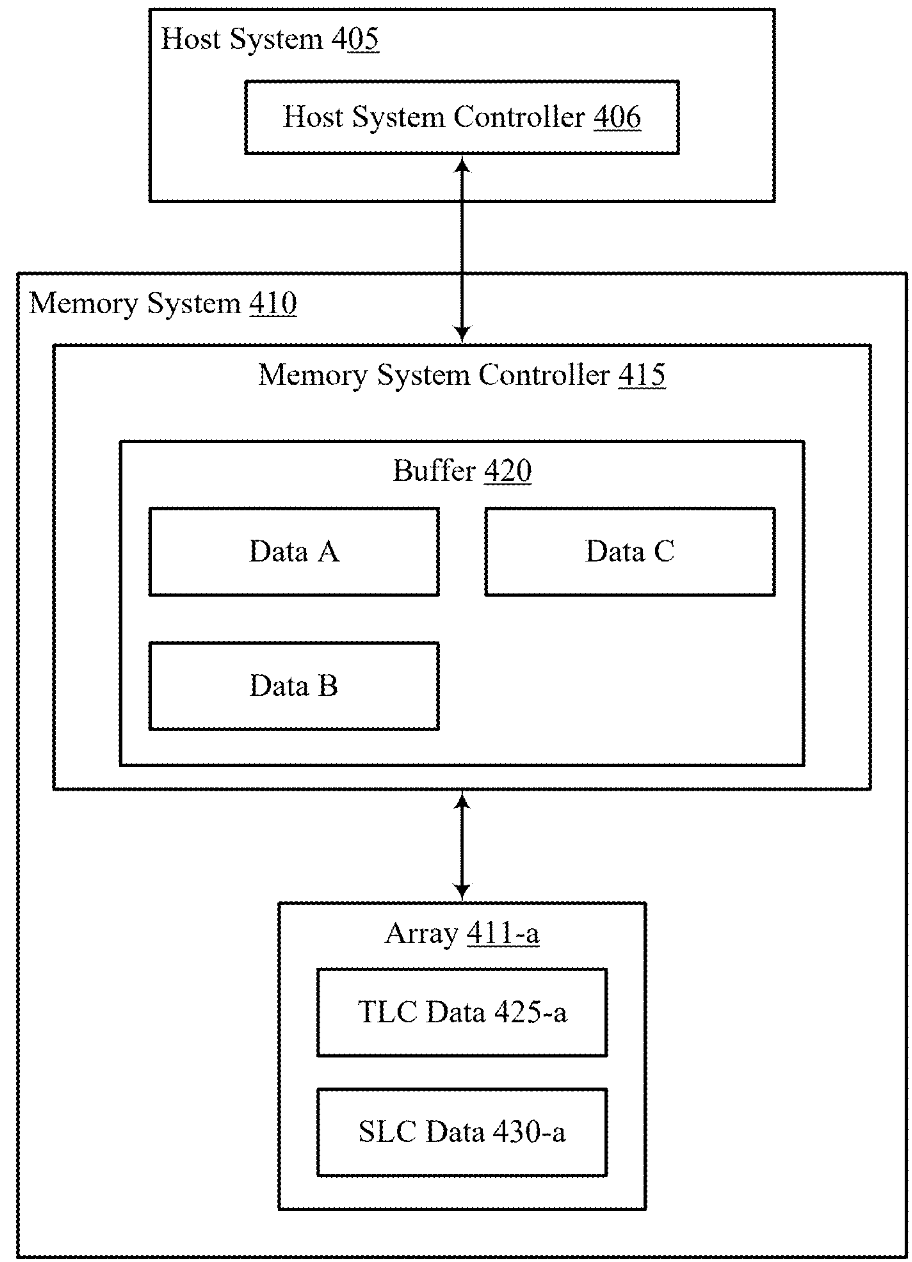
FIG. 4 shows an example of a system that supports establishing memory system RWB in accordance with examples as disclosed herein.

FIG. 4 shows an example of a system 400 that supports establishing memory system RWB in accordance with examples as disclosed herein. In some examples, the system 400 may implement, or be implemented by, one or more aspects of the system 100, the system 200, or the logic level diagram 300. For example, the system 400 may include a host system 405 coupled with a memory system 410 including one or more arrays 411 of memory cells, which may be examples of the host system 105 or 205 and the memory system 110 or 210, respectively. The host system 405 may include a host system controller 406 and the memory system 410 may include a memory system controller 415 with a buffer 420 (e.g., a local memory or one or more sets of memory cells of a larger array). As described herein, the host system 405 and the memory system 410 may perform one or more operations to establish RWB for memory cells of the memory system 410. For example, the host system controller 406 of the host system 405 may be operable to transmit multiple commands to the memory system 410 (e.g., to the memory system controller 415) each requesting the memory system 410 to calculate or measure RWBs (e.g., read budgets) corresponding to edges of logic levels for the memory system 410.

For an indicated edge, the memory system 400 may first determine an expected pattern, such as an expected set of data B corresponding to data stored in the array 411-*a*. The expected data B may be application data, and may be unknown to the memory system controller 415 (e.g., may effectively be random data). For example, the array 411-*a* may include one or more memory cells operable to store SLC data and TLC data. During a write operation, the memory system controller 415 may store initial data in the buffer 420, and may write the initial data to the array 411-*a* in the form of TLC data 425-*a* (e.g., stored using 8 logic levels). Additionally, the memory system controller 415 may write a subset of the data (e.g., one or more user defined RWB pages of the same data including same randomization seeds) in the form of SLC data 430-*a* (e.g., using 2 logic levels), which may be the expected data B corresponding to the initial data of the TLC data 425-*a*. The SLC data 430-*a* may then be read into the buffer 420 to store the expected data B (e.g., in an SRAM-B) for one or more operations. Additionally, or alternatively, the expected data B may be generated from the TLC data 425-*a* by reading the TLC data 425-*a* and performing correcting error correction code operations.

Using the expected data B (e.g., same user data, same randomized seed), the memory system 410 may perform a voltage sweep and compare operation to determine an RWB. For example, the memory system 410 may set a first read voltage (R_LV) to a first level at an initial offset value and perform a read operation of the TLC data 425-*a* of the array 411-*a*, and may store a resulting first set of data A (e.g., from the read of the TLC) in the buffer 420 (e.g., in an SRAM-A). The memory system 410 may also set other read voltages not associated with the edge to different offset values to reduce a level of noise in the resulting read. The memory system 410 may apply a mask to highlight an expected bit value for the edge using a logic function. For example, an AND function of the data A and the expected data B (e.g., determined by reading the SLC data 430-*a* or performing error correction on TLC data 425-*a*) may be used if the edge is expected to have a '1' value for a bit that flips across the edge to highlight '1' bit values, or an OR operation may be used if the edge is expected to have a '0' value to highlight '0' bit values. After storing a set of data C resulting from the logic function in the buffer 420 (e.g., in an SRAM-C), the memory system 410 may count a quantity of the expected bit values in the data C and store the result as a starting bit count.

The memory system 410 may repeat this process for one or more additional voltages of the sweep by storing a second set of data A' for a current read and performing a function to determine a current resulting data C'. At each iteration, the memory system 410 may find a difference between a current bit count of C' and the starting bit count of C to determine a quantity of bits that flipped between two corresponding read voltages. Once a threshold quantity of flipped bits is satisfied (e.g., a bit flip threshold), the memory system 410 may transmit a current offset voltage to the host system 405 which may correspond to an RWB for that edge (e.g., the host system 405 may determine corresponding RWBs from offset voltages). Additionally, although the examples described herein may involve TLC storage and SLC storage, NAND memory and SRAM, the operations performed herein may involve any type of memory storage, including determining RWB for logic levels of SLC storage, quad-level cell (QLC) memory storage, and other MLC storage, or using any combination of SLC, TLC, MLC and QLC storage to store data during voltage sweep operations.

The techniques described herein may further be performed if the memory system 410 has one or more capabilities. For example, the memory system 410 may support performing an AND operation and an OR operation on one or more bit values, counting a quantity of '0's or '1's for NAND output data, and performing a sweep of a base read level to count how many bits flip across an edge. The memory system 410 may also support one or more methods for determining a valley bottom of a logic level for an edge, which may represent a lowest distribution point of both distributions of two adjacent logic levels and that may be between the distributions, where the valley bottom may be used for performing the first read at the first level. In some examples, the SLC data 430-*a* may be associated with a low (~0) bit error rate (BER) for an expected pattern mask (e.g., may be "fresh" SLC). Additionally, or alternatively, for TCL, V, may be distributed across 8 levels as described and may have an overlap between distribution of adjacent levels below a threshold (e.g., NAND auto-read-calibration (ARC) may be functional), and may include functional memory cells in the TLC memory.

Figure 5A:
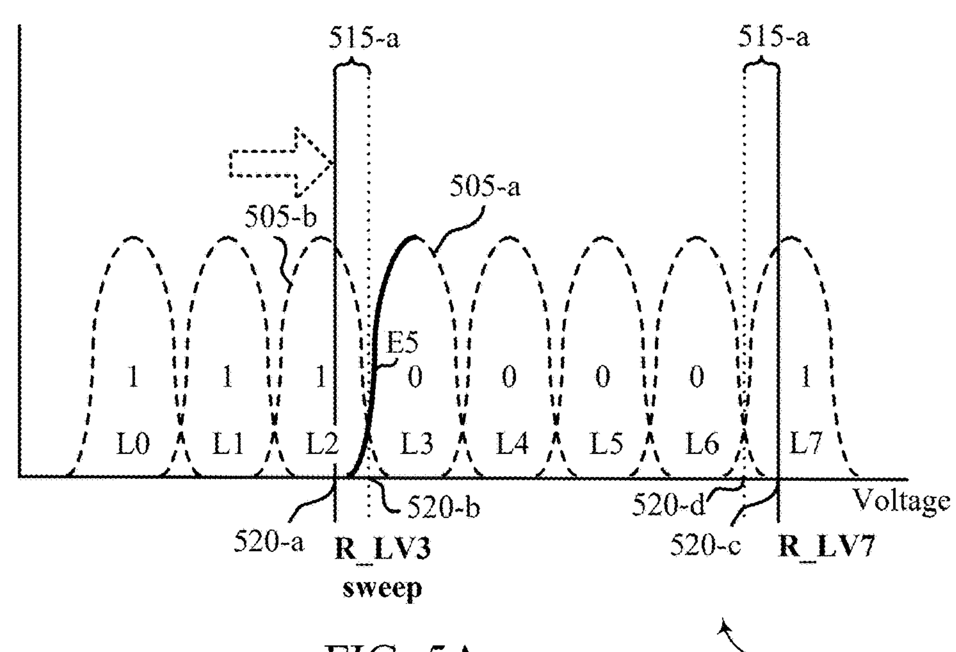
FIGS. 5A & 5B show examples of logic level diagrams that supports establishing memory system RWB in accordance with examples as disclosed herein.
Figure 5B:
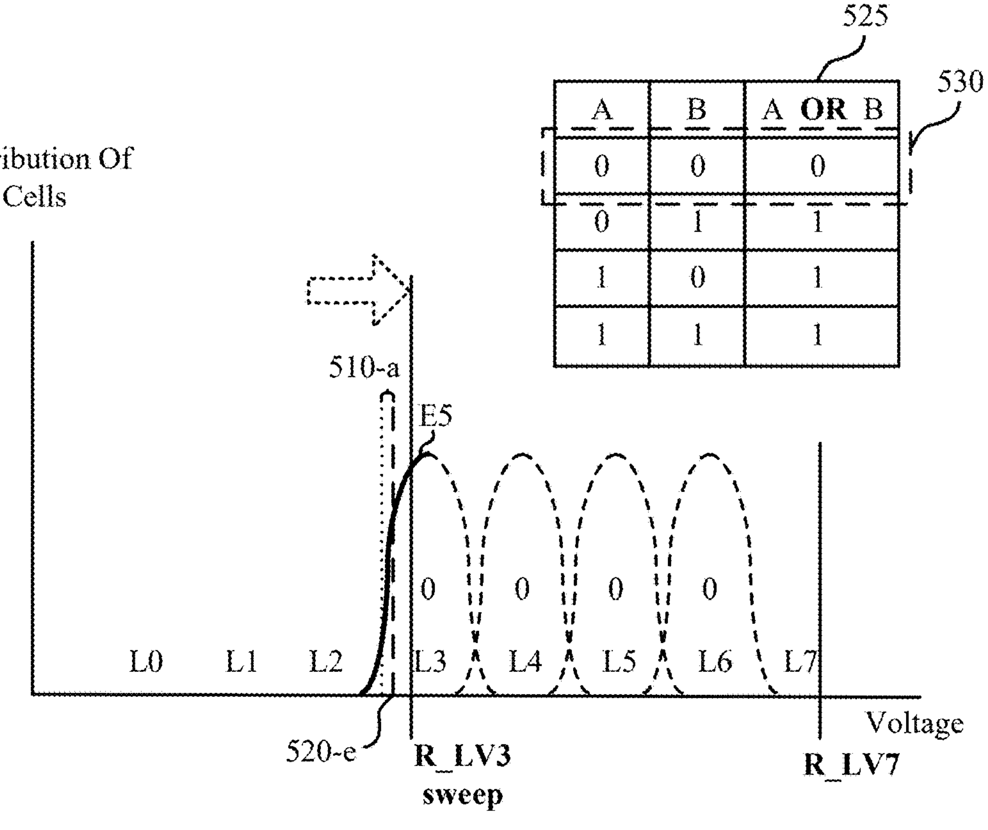

FIGS. 5A and 5B show examples of logic level diagrams 501 and 502 for an example voltage sweep operation that supports establishing memory system RWB in accordance with examples as disclosed herein. For example, the logic level diagrams 501 and 502 may represent an example voltage sweep operation for finding the edge E5 corresponding to the level LV3 of the eight logic levels L as represented in FIG. 3, which may be performed between the host system 405 and the memory system 410 described in FIG. 4. For example, the memory cells of one or more arrays of the memory system 410 may be programmed for TLC or SLC storage, where TLC storage may be associated with the eight levels L1-L7 with corresponding distributions 505 and RWBs 510. The edge E5 may particularly be a left edge of a distribution 505-*a* of the logic level L3.

To indicate to measure RWB of edge E5, the memory system 410 may receive a read command from the host system 405 indicating the edge E5. In response to the command, the memory system 410 may set a first read voltage R_LV3 to a first level 520-*a* to read a first set of memory cells (e.g., memory cells of the array 411-*a* storing TLC data 425). The first level 520-*a* may be at an initial offset 515-*a* (e.g.,–500 mV) from an original read level R_LV3 (e.g., between E5 (e.g., at a first logic level L3) and an adjacent logic level (e.g., at a second logic level L2)). For example, the offset 515-*a* may correspond to a level 520-*b* near or at a valley bottom of the distribution 505-*a* and an adjacent distribution 505-*b*, which in some cases may be a midpoint between the two associated logic levels or distributions. In some cases, the memory system 410 may be operable to calculate the valley bottom at the level 520-*b* (e.g., for TLC at an uncorrectable error correcting codes (UECC) page) using an error handling methodology or a syndrome weight read offset.

In some cases, the initial offset value of the offset 515-*a* may be defined as a width of two logic levels. For example, two adjacent logic levels (e.g., L2 and L3) may have a width that satisfies a threshold. For example, a width of two logic levels may be greater than or equal to 1000 mV, or a width less than 1000 mV may be tuned accordingly. For a 1000 mV width, an offset of 500 mV may be used (e.g., for noise reduction and starting near valley bottom). The width may also be less than 1500 mV in some cases. In some examples, the offset 515-*a* may be indicated in the read command received from the host system 405.

The memory system 410 may also determine an expected bit value for a bit that may flip across E5 for L3. For example, the memory system 410 may determine that memory cells at a voltage of the distribution 505-*a* of L3 are expected to store a TLC value of '000' according to the 2-3-2 grey code scheme, where L2 may be expected to store a TLC value of '100'. Notably, the bit value that may flip across E5 may be the XP bit, which may flip from a 'l' to a '0', where expected XP bits of each of the levels L0-L7 may be 1, 1, 1, 0, 0, 0, 0, 1, respectively. Thus, the expected bit value may be determined to be a '0' for the XP bit of L3. The memory system 410 may accordingly determine to isolate and count '0's which flip to find the RWB of E5 and may determine to find a bit count of the 0's for L3, L4, L5, and L6 as a starting value at 520-*a*.

The memory system 410 may also set one or more additional read voltages to different levels by applying respective offsets to isolate the '0's. For example, the memory system 410 may set R_LV7 to a level 520-*c* by adding a positive offset+515-a to R_LV7 with respect to a level 520-*d* at or near a valley bottom of distributions 505 of the logic levels L6 and L7. Notably, a change from L6 to L7 may correspond to the XP bit flipping from a 0 to a 1, and thus by setting the read voltage higher to an expected '1' area from valley bottom of L6, an L6 right edge (data '0') may be prevented from erroneously switching between LV6 and LV7 (data '1') in different read operations. By setting R_LV7 accordingly and keeping remaining read voltages at original levels while sweeping R_LV3 across E5, '0's that "flip" during the sweep may correspond to E5 but not to other edges, reducing noise in resulting reads. Notably, the initial offset value for the offset 515-*a* may be tuned to successfully remove this noise accordingly.

After setting the read voltages R_LV3 and R_LV7, the memory system 410 may then perform an initial read at the level 520-a of the TLC data, and may store a result in an SRAM-A (e.g., in the buffer 420). The memory system 410 may also determine and store expected data B (before or after the read) corresponding to the first set of memory cells by, for example, reading expected data stored in SLC memory or performing error correction on another read of the TLC data. After storing the expected and read data, the memory system 410 may perform a corresponding function A OR B=C, and may store C in an SRAM-C. Notably, performing the OR function of the expected data A in SRAM-A and the read data B in SRAM-B may isolate '0's that are found in both sets. For example, as illustrated in the truth table 525, an OR function results in a '1' for all bit combinations except for a row 530 of values of which both SRAM-A and SRAM-B have a '0'. Thus, the resulting data C stored in SRAM-C may include a list of bit values where all '0's in the set correspond to shared '0's between A and B, and so may isolate the distributions so that the distributions for which '0' is expected are focused as illustrated in FIG. 5B. After performing the OR function, the memory system 410 may count a total quantity of '0's in the resulting data C in SRAM-C to determine an initial or start count for the voltage sweep operation.

The memory system 410 may start to sweep R_LV3 to cover all L3 memory cells corresponding to E5 (e.g., with initial start at valley bottom). For example, the memory system 410 may set R_LV3 to one or more second levels 520, and for each second level 520, the memory system 410 may perform a read of the TLC blocks and store data A' into an SRAM-A' (e.g., overwriting same memory cells or storing in different memory cells than SRAM-A of the buffer 420). The memory system 410 may perform the OR function for each A' so that A' OR B=C', where C' may be stored in a different set of memory cells than C. The memory system 410 may then, for each new read level, compare a '0' count (e.g., quantity) of a respective C' to the initial count made at level 520-*a*. The difference between C' and C may correspond to a quantity of XP bits in the data that flipped from a '1' to a '0' between the read data A at the level 520-*a* and the read data A' at the next level 520. The memory system 410 may compare each difference (e.g., quantity of flipped bits) to a threshold that may correspond to the type of expected bit for that read level, or for XP bits for E5. Each type of bit may be associated with a different threshold (e.g., LP=XP-367 bits, UP=244 bits). During the sweep, R_LV7 may be kept at the same set level to reduce noise, and the memory system 410 may sweep from −515-*a* (at 520-*a*) to +515-a. In some examples, the sweep operation may be incremental. Additionally, or alternatively, the sweep may be a binary search, where a magnitude of an offset for a next level may be half of an offset for a previous level.

If the threshold is satisfied (e.g., current difference=threshold, that is, the reduction bit count in the area to the left of a current level meets the threshold), the memory system 410 may transmit a corresponding offset voltage to the host system 405. For example, the memory system 410 may transmit an offset voltage 510-*a* corresponding to an equivalent RWB of E5 to the host system 405 after counting a '0' count of A' or B=C' at a level 520-*c* and determining that the difference between C' and C is equal to the threshold for XP bits. The RWB may, for example, be defined as the voltage offset at 520-*e* with respect to an original read level R_LV3, which may be at a valley bottom between L3 and L2 (e.g., at a midpoint or a point near a midpoint between the two levels).

In some examples, the techniques described herein may be included in NAND verification to improve memory cell information in comparison. Further, system TLC closure scans may use RWB and may retire blocks with uncorrectable error correcting codes (UECC), where RWB may be added into a special event log (e.g., system RWB logs may contribute tracing back field overkill analysis for firmware algorithms). RWB also be used with system vender unique (VU) commands, where user data may be read out as CECC for expected pattern, and where RWB may be used in diagnosing issues during qualification reliability (REL) trials and testing (e.g., in case of a return material authorization (RMA)). Notably, system RWB may be communicated between components of a system including NAND to improve performance for SLC, TLC, QLC, MLC, and other memories and to determine issues in firmware or NAND potential memory errors, as well as used for PFW and VU commands in SSD devices. Further, RWB calculations as described herein may be associated with a decreases latency by implementing a binary search algorithm.

Figure 6A:
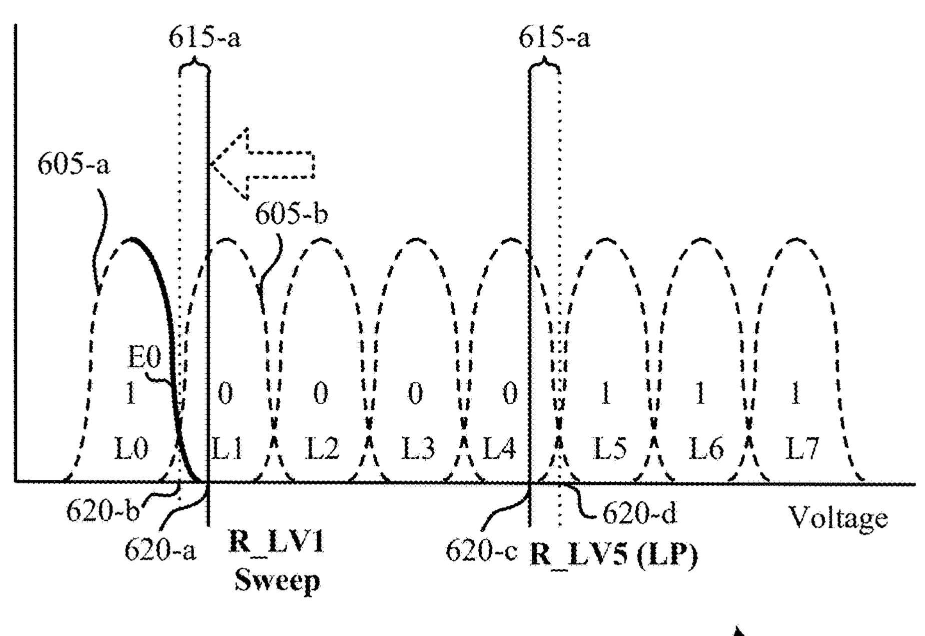
FIGS. 6A & 6B show examples of logic level diagrams that supports establishing memory system RWB in accordance with examples as disclosed herein.
Figure 6B:
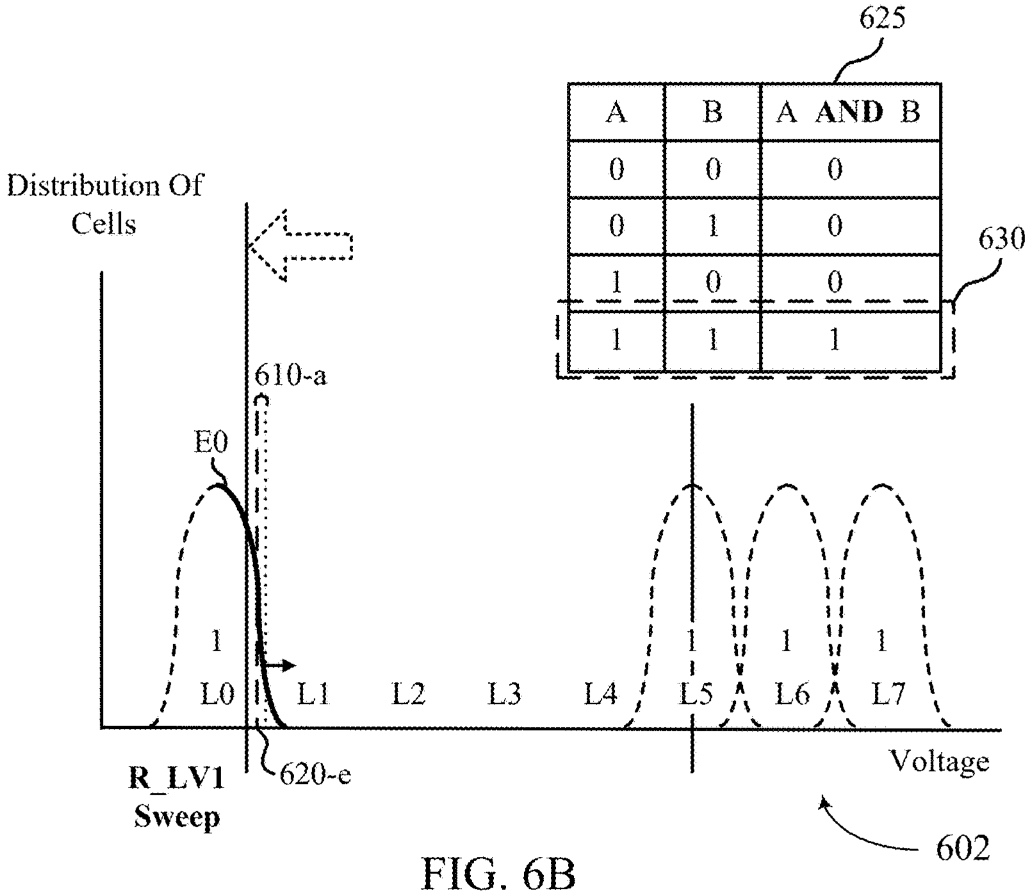

FIGS. 6A and 6B shows an example of logic level diagrams 601 and 602 for an example voltage sweep operation that supports establishing memory system RWB in accordance with examples as disclosed herein. For example, the logic level diagrams 601 and 602 may represent an example voltage sweep operation for finding the edge E1 corresponding to the level LV0 of the eight logic levels L described in FIGS. 5A and 5B with distributions 605 (e.g., 605-*a* and 605-*b* for L0 and L1, respectively) and corresponding RWBs 610.

For example, after receiving a read command indicating edge E0 (and corresponding distribution 605-*a*) and an offset 615-*a*, the memory system 410 may determine that an LP bit flips across E0 and has an expected value of '1' (e.g., from '111' value for L0 for 2-3-2 gray code), and that expected LP bits are 1, 0, 0, 0, 0, 1, 1, 1 for L0-L7, respectively. For the expected value of '1', the memory system 410 may perform an AND function for an RWB mask. The memory system 410 may also perform a voltage sweep by setting R_LV1 initially to a level 620-*a* at an offset+615-a (e.g., +500 mV) from an initial level 620-*b*, and may set R_LV5 to a level 620-*c* shifted down by the offset 615-*a* (e.g., −500 mV) from an initial level 620-*d* to avoid noise from L5 during the read. For example, the memory system 410 may sweep R_LV1 (e.g., using a 500 mV offset with a 10 mV step resolution) from +500 mV to −500 mV to get an LP AND SLC '1' count (e.g., as illustrated to isolate '1's in a row 630 of a truth table 625), may record the level 620-*e* at which the '1' count change reaches a threshold (e.g., LP single edge threshold=18352B*(1e-$^{2}$)/4 edges=367 bits), and may output the found RWB 610-*a* to the host system 405.

The system 400, including the memory system 410 and the host system 405, may use similar voltage sweep operations to find each of edges E0-E14 illustrated in FIG. 3. For example, each of edges E0-E14 are shown below in Table 1, including respective associated bits that will flip across an edge, expected values for the flipped bit, respective bit functions to perform, respective read voltages for sweeping with a starting offset, as well as additional read voltages to adjust with respective offsets to reduce noise. For example, the edge E2 may be associated with a UP bit with an expected value of '1', and so many involve an AND operation and sweeping R_LV2 with a start offset at +615-a while offsetting R_LV4 and R_LV6 to −615-*a* and +615-a, respectively, to reduce noise. In some cases, measuring an RWB for the edge E14 may involve offsetting R_LV7 to 2 times the original offset (e.g., 2× 615-*a*) and sweeping to an offset of 0.

TABLE 1

| Edge | Flipped Bit | Expected Bit Value | Bit Function | Sweeping Read Voltage | Starting Offset | Additional Read voltages to adjust | Offset(s) |
|---|---|---|---|---|---|---|---|
| E0 | LP | 1 | AND | R_LV1 | +615-a | R_LV5 | −615 a |
| E1 | LP | 0 | OR | R_LV1 | −615-a | R_LV5 | +615 a |
| E2 | UP | 1 | AND | R_LV2 | +615-a | R_LV4, R_LV6 | −615 a, +615 a |
| E3 | UP | 0 | OR | R_LV2 | −615-a | R_LV4, R_LV6 | +615 a, −615 a |
| E4 | XP | 1 | AND | R_LV3 | +615-a | R_LV7 | −615 a |
| E5 | XP | 0 | OR | R_LV3 | −615-a | R_LV7 | +615 a |
| E6 | UP | 0 | OR | R_LV4 | +615-a | R_LV2, R_LV6 | −615 a, −615 a |
| E7 | UP | 1 | AND | R_LV4 | −615-a | R_LV2, R_LV6 | +615 a, +615 a |
| E8 | LP | 0 | OR | R_LV5 | +615-a | R_LV1 | −615 a |
| E9 | LP | 1 | AND | R_LV5 | −615-a | R_LV1 | +615 a |
| E10 | UP | 1 | AND | R_LV6 | +615-a | R_LV2, R_LV4 | +615 a, −615 a |
| E11 | UP | 0 | OR | R_LV6 | −615-a | R_LV2, R_LV4 | −615 a, +615 a |
| E12 | XP | 0 | OR | R_LV7 | +615-a | R_LV3 | −615 a |
| E13 | XP | 1 | AND | R_LV7 | −615-a | R_LV3 | +615 a |
| E14 | XP | 1 | AND | R_LV7 | +2(615-a) | R_LV3 | +615 a |

Figure 7:
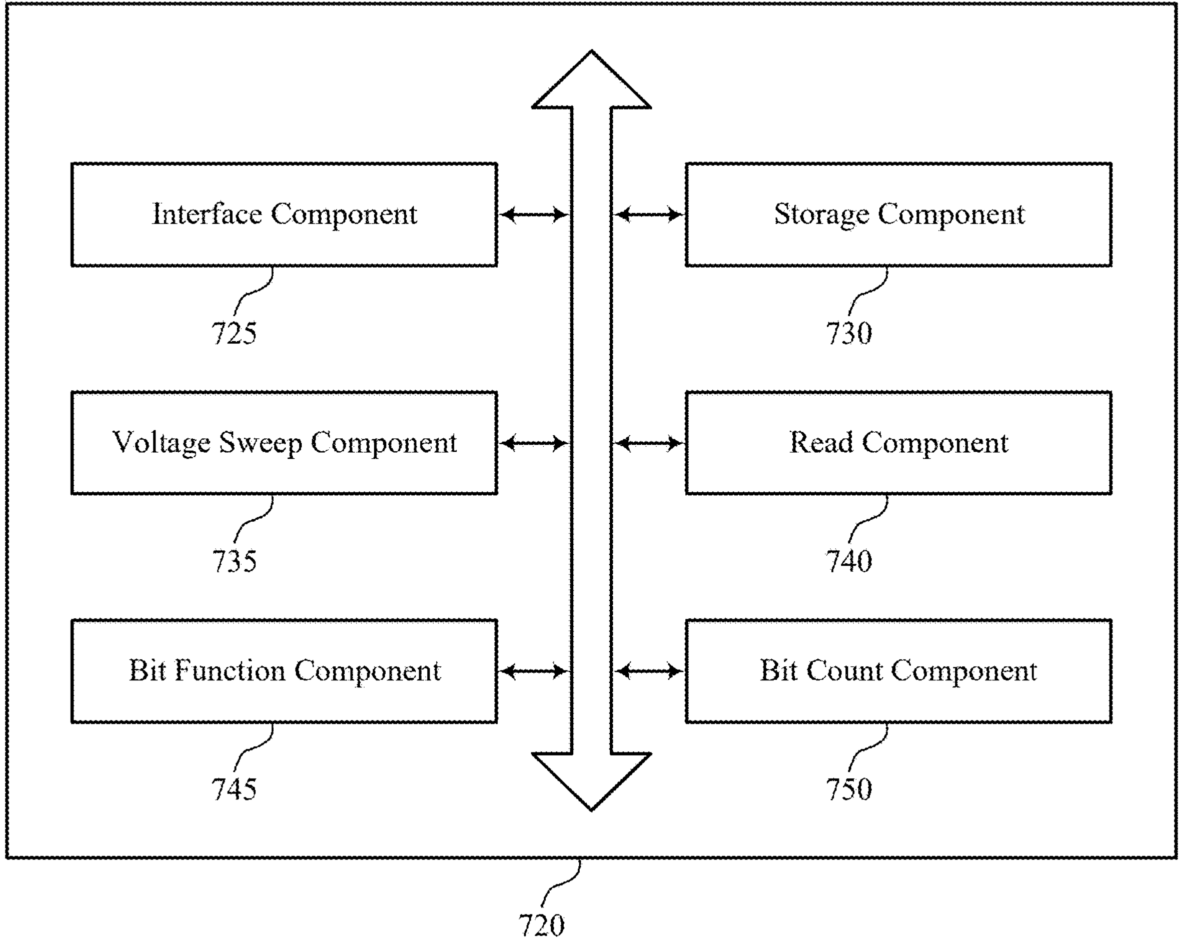
FIG. 7 shows a block diagram of a memory system that supports establishing memory system RWB in accordance with examples as disclosed herein.

FIG. 7 shows a block diagram 700 of a memory system 720 that supports establishing memory system read window budget in accordance with examples as disclosed herein. The memory system 720 may be an example of aspects of a memory system as described with reference to FIGS. 1 through 6. The memory system 720, or various components thereof, may be an example of means for performing various aspects of establishing memory system read window budget as described herein. For example, the memory system 720 may include an interface component 725, a storage component 730, a voltage sweep component 735, a read component 740, a bit function component 745, a bit count component 750, or any combination thereof. Each of these components, or components of subcomponents thereof (e.g., one or more processors, one or more memories), may communicate, directly or indirectly, with one another (e.g., via one or more buses).

The interface component 725 may be configured as or otherwise support a means for receiving a command associated with determining a read budget of a first edge of a first logic level of a plurality of logic levels for an array of memory cells, where a set of initial data is stored in a first set of memory cells of the array of memory cells using the plurality of logic levels, the plurality of logic levels being associated with one or more MLC programming operations. The storage component 730 may be configured as or otherwise support a means for storing a set of expected data in a second set of memory cells of the array of memory cells using an SLC programming operation based at least in part on receiving the command, where the set of expected data corresponds to the set of initial data. The voltage sweep component 735 may be configured as or otherwise support a means for performing a voltage sweep operation. As part of the voltage sweep operation, the read component 740 may be configured as or otherwise support a means for setting a first read voltage to a first level for reading the first set of memory cells. In some examples, the read component 740 may be configured as or otherwise support a means for reading a first set of data from the first set of memory cells based at least in part on setting the first read voltage to the first level. In some examples, the read component 740 may be configured as or otherwise support a means for setting the first read voltage to a second level based at least in part on a first quantity of bit values that is based at least in part on a function of the first set of data read from the first set of memory cells and the set of expected data (e.g., a function performed by bit function component 745). In some examples, the read component 740 may be configured as or otherwise support a means for reading a second set of data from the first set of memory cells based at least in part on setting the first read voltage to the second level. The bit function component 745 may be configured as or otherwise support a means for determining a second quantity of bit values based at least in part on a function of the second set of data read from the first set of memory cells and the set of expected data. In some examples, the interface component 725 may be configured as or otherwise support a means for transmitting an offset voltage, corresponding to the read budget and based at least in part on the first level and the second level, based at least in part on a difference between the second quantity of bit values and the first quantity of bit values satisfying a threshold quantity.

In some examples, the bit count component 750 may be configured as or otherwise support a means for determining an expected bit value associated with the first edge and the first logic level of the plurality of logic levels, where determining the first quantity of bit values and the second quantity of bit values is based at least in part on counting respective quantities of the expected bit value within the first set of data and the second set of data.

In some examples, the functions include AND logic functions based at least in part on the expected bit value being a one, or include OR logic functions based at least in part on the expected bit value being a zero.

In some examples, to support determining the second quantity of bit values, the storage component 730 may be configured as or otherwise support a means for storing the set of expected data in a first set of memory cells of a buffer. In some examples, to support determining the second quantity of bit values, the storage component 730 may be configured as or otherwise support a means for storing the second set of data in a second set of memory cells of the buffer. In some examples, to support determining the second quantity of bit values, the storage component 730 may be configured as or otherwise support a means for storing a third set of data in a third set of memory cells of the buffer based at least in part on the function of the second set of data read from the first set of memory cells and the set of expected data. In some examples, to support determining the second quantity of bit values, the bit count component 750 may be configured as or otherwise support a means for counting a quantity of bits in the third set of data that correspond to an expected bit value associated with the first edge and the first logic level of the plurality of logic levels, where the second quantity of bit values corresponds to the quantity of bits.

In some examples, the read component 740 may be configured as or otherwise support a means for setting a second read voltage to a third level, where the second read voltage is associated with a second logic level of the plurality of logic levels different from the first logic level.

In some examples, the read component 740 may be configured as or otherwise support a means for setting a third read voltage to a fourth level, where the third read voltage is associated with a third logic level of the plurality of logic levels different from the first logic level and the second logic level.

In some examples, a magnitude of an offset value for the second level is half of a magnitude of an initial offset value for the first level. In some examples, the offset voltage is based at least in part on a difference between the second level and a level between the first logic level and a second logic level of the plurality of logic levels. In some examples, the first level is based at least in part on an initial offset value and a level between the first logic level and a second logic level of the plurality of logic levels. In some examples, the initial offset value is based at least in part on a width of two logic levels of the plurality of logic levels.

In some examples, the storage component 730 may be configured as or otherwise support a means for storing a set of expected data in a second set of memory cells of the array of memory cells using an SLC programming operation based at least in part on identifying a set of initial data in a buffer corresponding to data stored in a first set of memory cells of the array of memory cells using the plurality of logic levels. In some examples, the voltage sweep component 735 may be configured as or otherwise support a means for determining an offset voltage associated with a level based at least in part on setting a read voltage to the level and determining that a difference between a quantity of bit values, associated with a function of a set of data read from the first set of memory cells and the set of expected data, and an initial quantity of bit values satisfies a threshold quantity. In some examples, the interface component 725 may be configured as or otherwise support a means for transmitting the offset voltage, corresponding to a read budget of the plurality of read budgets and associated with the level, to the host system based at least in part on determining difference between the quantity of bit values and the initial quantity of bit values satisfies the threshold quantity.

In some examples, for each command of the plurality of commands, the memory system is further operable to set the read voltage to a plurality of levels including the level. In some examples, determining the offset voltage is based at least in part on determining that one or more differences of quantities of bit values, associated with one or more additional levels of the plurality of levels, and the initial quantity of bit values fail to satisfy the threshold quantity.

In some examples, for each command of the plurality of commands, the memory system is further operable to determine an expected bit value associated with an edge of a logic level of the plurality of logic levels. In some examples, the quantity of bit values is based at least in part on counting quantities of the expected bit value within the set of data. In some examples, for each command of the plurality of commands, the memory system is further operable to set the read voltage to an initial level. In some examples, the initial level is based at least in part on an initial voltage offset value and a level between a first logic level and a second logic level of the plurality of logic levels. In some examples, each of the plurality of commands indicates one or more offsets associated with the edges of the plurality of logic levels.

In some examples, the described functionality of the memory system 720, or various components thereof, may be supported by or may refer to at least a portion of at least one processor, where such at least one processor may include one or more processing elements (e.g., a controller, a microprocessor, a microcontroller, a digital signal processor, a state machine, discrete gate logic, discrete transistor logic, discrete hardware components, or any combination of one or more of such elements). In some examples, the described functionality of the memory system 720, or various components thereof, may be implemented at least in part by instructions (e.g., stored in memory, non-transitory computer-readable medium) executable by such at least one processor.

Figure 8:
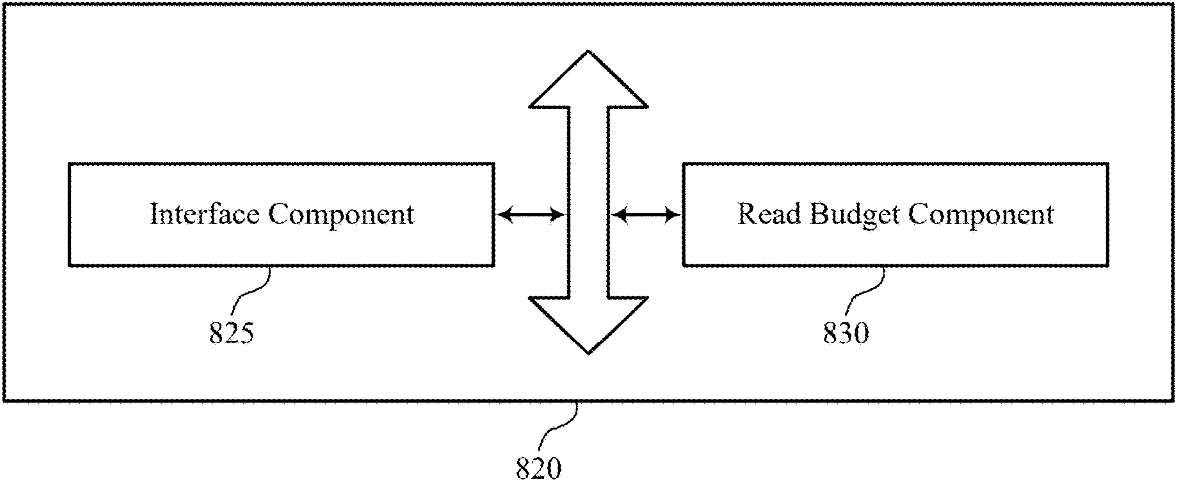
FIG. 8 shows a block diagram of a host system that supports establishing memory system RWB in accordance with examples as disclosed herein.

FIG. 8 shows a block diagram 800 of a system including a host system 820 that supports establishing memory system read window budget in accordance with examples as disclosed herein. The host system 820 may be an example of aspects of a host system as described with reference to FIGS. 1 through 6. The host system 820, or various components thereof, may be an example of means for performing various aspects of establishing memory system read window budget as described herein. For example, the host system 820 may include an interface component 825 a read budget component 830, or any combination thereof. Each of these components, or components of subcomponents thereof (e.g., one or more processors, one or more memories), may communicate, directly or indirectly, with one another (e.g., via one or more buses).

The interface component 825 may be configured as or otherwise support a means for transmitting a plurality of commands to the memory system associated with determining a plurality of read budgets corresponding to edges of a plurality of logic levels for the array of memory cells. The read budget component 830 may be configured as or otherwise support a means for determining the plurality of read budgets based at least in part on a plurality of offset voltages received from the memory system, where the plurality of offset voltages are associated with the edges of the plurality of logic levels. In some examples, each of the plurality of commands indicates one or more offsets associated with the edges of the plurality of logic levels.

In some examples, the described functionality of the host system 820, or various components thereof, may be supported by or may refer to at least a portion of at least one processor, where such at least one processor may include one or more processing elements (e.g., a controller, a microprocessor, a microcontroller, a digital signal processor, a state machine, discrete gate logic, discrete transistor logic, discrete hardware components, or any combination of one or more of such elements). In some examples, the described functionality of the host system 820, or various components thereof, may be implemented at least in part by instructions (e.g., stored in memory, non-transitory computer-readable medium) executable by such at least one processor.

Figure 9:
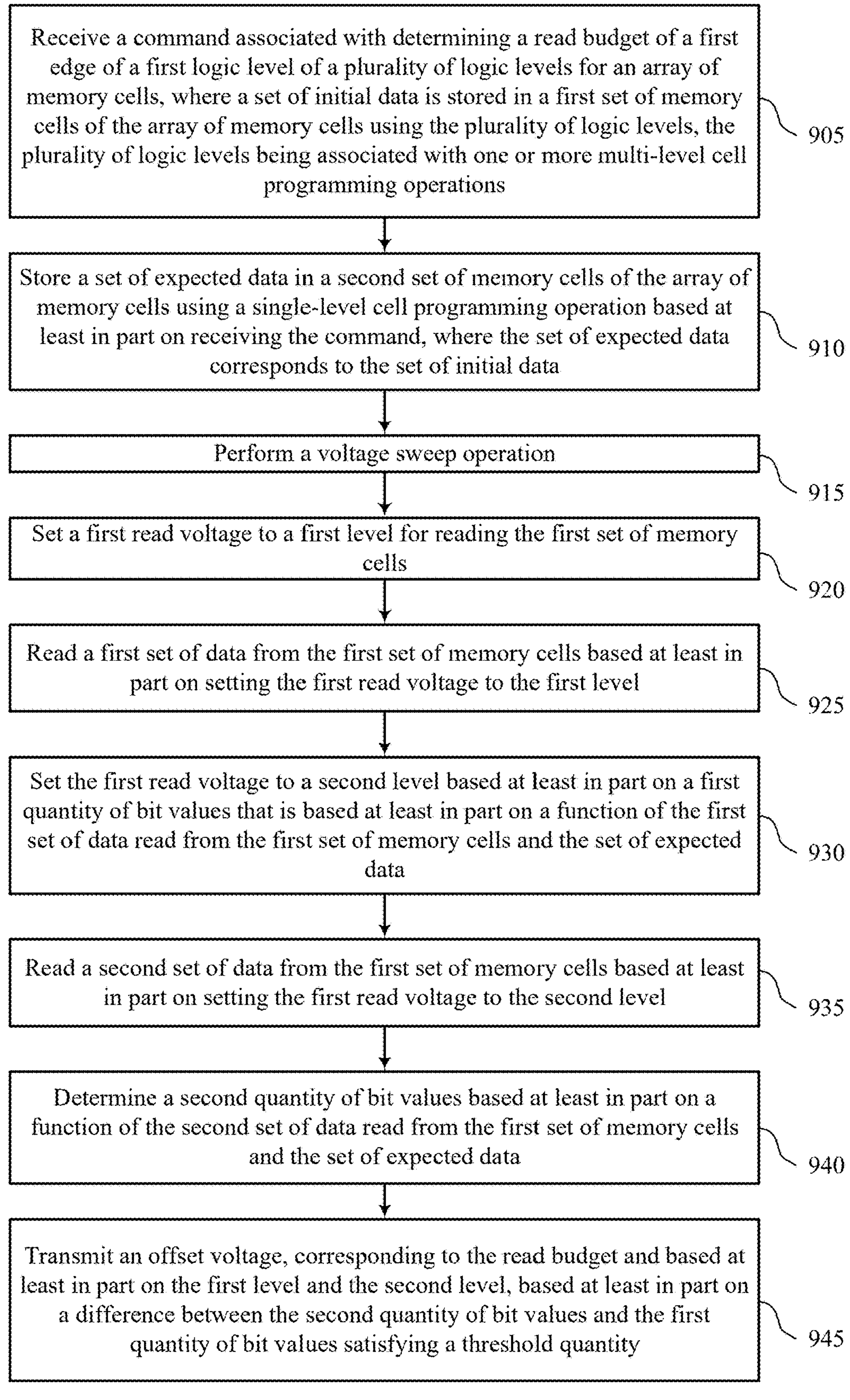

FIG. 9 shows a flowchart illustrating a method 900 that supports establishing memory system read window budget in accordance with examples as disclosed herein. The operations of method 900 may be implemented by a memory system or its components as described herein. For example, the operations of method 900 may be performed by a memory system as described with reference to FIGS. 1 through 7. In some examples, a memory system may execute a set of instructions to control the functional elements of the device to perform the described functions. Additionally, or alternatively, the memory system may perform aspects of the described functions using special-purpose hardware.

At 905, the method may include receiving a command associated with determining a read budget of a first edge of a first logic level of a plurality of logic levels for an array of memory cells, where a set of initial data is stored in a first set of memory cells of the array of memory cells using the plurality of logic levels, the plurality of logic levels being associated with one or more multi-level cell programming operations. In some examples, aspects of the operations of 905 may be performed by an interface component 725 as described with reference to FIG. 7.

At 910, the method may include storing a set of expected data in a second set of memory cells of the array of memory cells using an SLC cell programming operation based at least in part on receiving the command, where the set of expected data corresponds to the set of initial data. In some examples, aspects of the operations of 910 may be performed by a storage component 730 as described with reference to FIG. 7.

At 915, the method may include performing a voltage sweep operation, including the steps performed at 920-940. In some examples, aspects of the operations of 915 may be performed by a voltage sweep component 735 as described with reference to FIG. 7.

At 920, the method may include setting a first read voltage to a first level for reading the first set of memory cells. In some examples, aspects of the operations of 920 may be performed by a read component 740 as described with reference to FIG. 7.

At 925, the method may include reading a first set of data from the first set of memory cells based at least in part on setting the first read voltage to the first level. In some examples, aspects of the operations of 925 may be performed by a read component 740 as described with reference to FIG. 7.

At 930, the method may include setting the first read voltage to a second level based at least in part on a first quantity of bit values that is based at least in part on a function of the first set of data read from the first set of memory cells and the set of expected data. In some examples, aspects of the operations of 930 may be performed by a read component 740 as described with reference to FIG. 7.

At 935, the method may include reading a second set of data from the first set of memory cells based at least in part on setting the first read voltage to the second level. In some examples, aspects of the operations of 935 may be performed by a read component 740 as described with reference to FIG. 7.

At 940, the method may include determining a second quantity of bit values based at least in part on a function of the second set of data read from the first set of memory cells and the set of expected data. In some examples, aspects of the operations of 940 may be performed by a bit function component 745 as described with reference to FIG. 7.

At 945, the method may include transmitting an offset voltage, corresponding to the read budget and based at least in part on the first level and the second level, based at least in part on a difference between the second quantity of bit values and the first quantity of bit values satisfying a threshold quantity. In some examples, aspects of the operations of 945 may be performed by an interface component 725 as described with reference to FIG. 7.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a command associated with determining a read budget of a first edge of a first logic level of a plurality of logic levels for an array of memory cells, where a set of initial data is stored in a first set of memory cells of the array of memory cells using the plurality of logic levels, the plurality of logic levels being associated with one or more MLC programming operations; storing a set of expected data in a second set of memory cells of the array of memory cells using an SLC programming operation based at least in part on receiving the command, where the set of expected data corresponds to the set of initial data; performing a voltage sweep operation, including; setting a first read voltage to a first level for reading the first set of memory cells; reading a first set of data from the first set of memory cells based at least in part on setting the first read voltage to the first level; setting the first read voltage to a second level based at least in part on a first quantity of bit values that is based at least in part on a function of the first set of data read from the first set of memory cells and the set of expected data; reading a second set of data from the first set of memory cells based at least in part on setting the first read voltage to the second level; determining a second quantity of bit values based at least in part on a function of the second set of data read from the first set of memory cells and the set of expected data; and transmitting an offset voltage, corresponding to the read budget and based at least in part on the first level and the second level, based at least in part on a difference between the second quantity of bit values and the first quantity of bit values satisfying a threshold quantity.

Aspect 2: The method, apparatus, or non-transitory computer-readable medium of aspect 1, further including operations, features, circuitry, logic, means, or instructions, or any combination thereof for determining an expected bit value associated with the first edge and the first logic level of the plurality of logic levels, where determining the first quantity of bit values and the second quantity of bit values is based at least in part on counting respective quantities of the expected bit value within the first set of data and the second set of data.

Aspect 3: The method, apparatus, or non-transitory computer-readable medium of aspect 2, where the functions include AND logic functions based at least in part on the expected bit value being a one, or include OR logic functions based at least in part on the expected bit value being a zero.

Aspect 4: The method, apparatus, or non-transitory computer-readable medium of any of aspects 1 through 3, where determining the second quantity of bit values includes operations, features, circuitry, logic, means, or instructions, or any combination thereof for storing the set of expected data in a first set of memory cells of a buffer; storing the second set of data in a second set of memory cells of the buffer; storing a third set of data in a third set of memory cells of the buffer based at least in part on the function of the second set of data read from the first set of memory cells and the set of expected data; and counting a quantity of bits in the third set of data that correspond to an expected bit value associated with the first edge and the first logic level of the plurality of logic levels, where the second quantity of bit values corresponds to the quantity of bits.

Aspect 5: The method, apparatus, or non-transitory computer-readable medium of any of aspects 1 through 4, further including operations, features, circuitry, logic, means, or instructions, or any combination thereof for setting a second read voltage to a third level, where the second read voltage is associated with a second logic level of the plurality of logic levels different from the first logic level.

Aspect 6: The method, apparatus, or non-transitory computer-readable medium of aspect 5, further including operations, features, circuitry, logic, means, or instructions, or any combination thereof for setting a third read voltage to a fourth level, where the third read voltage is associated with a third logic level of the plurality of logic levels different from the first logic level and the second logic level.

Aspect 7: The method, apparatus, or non-transitory computer-readable medium of any of aspects 1 through 6, where a magnitude of an offset value for the second level is half of a magnitude of an initial offset value for the first level.

Aspect 8: The method, apparatus, or non-transitory computer-readable medium of any of aspects 1 through 7, where the offset voltage is based at least in part on a difference between the second level and a level between the first logic level and a second logic level of the plurality of logic levels.

Aspect 9: The method, apparatus, or non-transitory computer-readable medium of any of aspects 1 through 8, where the first level is based at least in part on an initial offset value and a level between the first logic level and a second logic level of the plurality of logic levels.

Aspect 10: The method, apparatus, or non-transitory computer-readable medium of aspect 9, where the initial offset value is based at least in part on a width of two logic levels of the plurality of logic levels.

FIG. 10 shows a flowchart illustrating a method 1000 that supports establishing memory system read window budget in accordance with examples as disclosed herein. The operations of method 1000 may be implemented by a host system or its components as described herein. For example, the operations of method 1000 may be performed by a host system coupled with a memory system including an array of memory cells as described with reference to FIGS. 1 through 6 and 8. In some examples, a host system may execute a set of instructions to control the functional elements of the device to perform the described functions. Additionally, or alternatively, the host system may perform aspects of the described functions using special-purpose hardware.

At 1005, the method may include transmitting a plurality of commands to a memory system associated with determining a plurality of read budgets corresponding to edges of a plurality of logic levels for an array of memory cells. In some examples, aspects of the operations of 1005 may be performed by an interface component 825 as described with reference to FIG. 8.

At 1010, the method may include determining the plurality of read budgets based at least in part on a plurality of offset voltages received from the memory system, where the plurality of offset voltages are associated with the edges of the plurality of logic levels. In some examples, aspects of the operations of 1010 may be performed by a read budget component 830 as described with reference to FIG. 8.

In some examples, an apparatus as described herein may perform a method or methods, such as the method 1000. The apparatus may include features, circuitry, logic, means, or instructions (e.g., a non-transitory computer-readable medium storing instructions executable by a processor), or any combination thereof for performing the following aspects of the present disclosure:

Aspect 11: A method, apparatus, or non-transitory computer-readable medium including operations, features, circuitry, logic, means, or instructions, or any combination thereof for transmitting a plurality of commands to a memory system associated with determining a plurality of read budgets corresponding to edges of a plurality of logic levels for the array of memory cells and determining the plurality of read budgets based at least in part on a plurality of offset voltages received from the memory system, where the plurality of offset voltages are associated with the edges of the plurality of logic levels.

Aspect 12: The method, apparatus, or non-transitory computer-readable medium of aspect 11, where each of the plurality of commands indicates one or more offsets associated with the edges of the plurality of logic levels.

FIG. 11 shows a flowchart illustrating a method 1100 that supports establishing memory system read window budget in accordance with examples as disclosed herein. The operations of method 1100 may be implemented by a memory system or its components as described herein. For example, the operations of method 1100 may be performed by a memory system including an array of memory cells and coupled with a host system as described with reference to FIGS. 1 through 7. In some examples, a memory system may execute a set of instructions to control the functional elements of the device to perform the described functions. Additionally, or alternatively, the memory system may perform aspects of the described functions using special-purpose hardware.

At 1105, the method may include storing a set of expected data in a second set of memory cells of an array of memory cells using a single-level cell programming operation based at least in part on identifying a set of initial data in a buffer corresponding to data stored in a first set of memory cells of the array of memory cells using a plurality of logic levels. In some examples, aspects of the operations of 1105 may be performed by a storage component 730 as described with reference to FIG. 7.

At 1110, the method may include determining an offset voltage associated with a level based at least in part on setting a read voltage to the level and determining that a difference between a quantity of bit values, associated with a function of a set of data read from the first set of memory cells and the set of expected data, and an initial quantity of bit values satisfies a threshold quantity. In some examples, aspects of the operations of 1110 may be performed by a voltage sweep component 735 as described with reference to FIG. 7.

At 1115, the method may include transmitting the offset voltage, corresponding to a read budget of the plurality of read budgets and associated with the level, to the host system based at least in part on determining difference between the quantity of bit values and the initial quantity of bit values satisfies the threshold quantity. In some examples, aspects of the operations of 1115 may be performed by an interface component 725 as described with reference to FIG. 7.

In some examples, an apparatus as described herein may perform a method or methods, such as the method 1100. The apparatus may include features, circuitry, logic, means, or instructions (e.g., a non-transitory computer-readable medium storing instructions executable by a processor), or any combination thereof for performing the following aspects of the present disclosure:

Aspect 13: A method, apparatus, or non-transitory computer-readable medium including operations, features, circuitry, logic, means, or instructions, or any combination thereof for storing a set of expected data in a second set of memory cells of the array of memory cells using an SLC programming operation based at least in part on identifying a set of initial data in a buffer corresponding to data stored in a first set of memory cells of the array of memory cells using a plurality of logic levels; determining an offset voltage associated with a level based at least in part on setting a read voltage to the level and determining that a difference between a quantity of bit values, associated with a function of a set of data read from the first set of memory cells and the set of expected data, and an initial quantity of bit values satisfies a threshold quantity; and transmitting the offset voltage, corresponding to a read budget of a plurality of read budgets and associated with the level, to the host system based at least in part on determining difference between the quantity of bit values and the initial quantity of bit values satisfies the threshold quantity.

Aspect 14: The method, apparatus, or non-transitory computer-readable medium of aspect 13, where, for each command of a plurality of commands, the memory system is further operable to set the read voltage to a plurality of levels including the level and determining the offset voltage is based at least in part on determining that one or more differences of quantities of bit values, associated with one or more additional levels of the plurality of levels, and the initial quantity of bit values fail to satisfy the threshold quantity.

Aspect 15: The method, apparatus, or non-transitory computer-readable medium of any of aspects 13 through 14, where, for each command of the plurality of commands, the memory system is further operable to determine an expected bit value associated with an edge of a logic level of the plurality of logic levels and the quantity of bit values is based at least in part on counting quantities of the expected bit value within the set of data.

Aspect 16: The method, apparatus, or non-transitory computer-readable medium of any of aspects 13 through 15, where, for each command of the plurality of commands, the memory system is further operable to set the read voltage to an initial level and the initial level is based at least in part on an initial voltage offset value and a level between a first logic level and a second logic level of the plurality of logic levels.

Aspect 17: The method, apparatus, or non-transitory computer-readable medium of any of aspects 13 through 16, where each of the plurality of commands indicates one or more offsets associated with edges of the plurality of logic levels.

It should be noted that the described techniques include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 18: A system, including, including: a host system coupled with a memory system including an array of memory cells, where a controller of the host system is operable to: transmit a plurality of commands to the memory system associated with determining a plurality of read budgets corresponding to edges of a plurality of logic levels for the array of memory cells; and determine the plurality of read budgets based at least in part on a plurality of offset voltages received from the memory system, where the plurality of offset voltages are associated with the edges of the plurality of logic levels; and the memory system including the array of memory cells, where, for each command of the plurality of commands, the memory system is operable to: store a set of expected data in a second set of memory cells of the array of memory cells using an SLC programming operation based at least in part on identifying a set of initial data in a buffer corresponding to data stored in a first set of memory cells of the array of memory cells using the plurality of logic levels; determine an offset voltage associated with a level based at least in part on setting a read voltage to the level and determining that a difference between a quantity of bit values, associated with a function of a set of data read from the first set of memory cells and the set of expected data, and an initial quantity of bit values satisfies a threshold quantity; and transmit the offset voltage, corresponding to a read budget of the plurality of read budgets and associated with the level, to the host system based at least in part on determining difference between the quantity of bit values and the initial quantity of bit values satisfies the threshold quantity.

Aspect 19: The system of aspect 18, where, for each command of the plurality of commands, the memory system is further operable to: set the read voltage to a plurality of levels including the level, where determining the offset voltage is based at least in part on determining that one or more differences of quantities of bit values, associated with one or more additional levels of the plurality of levels, and the initial quantity of bit values fail to satisfy the threshold quantity.

Aspect 20: The system of any of aspects 18 through 19, where, for each command of the plurality of commands, the memory system is further operable to: determine an expected bit value associated with an edge of a logic level of the plurality of logic levels, where the quantity of bit values is based at least in part on counting quantities of the expected bit value within the set of data.

Aspect 21: The system of any of aspects 18 through 20, where, for each command of the plurality of commands, the memory system is further operable to: set the read voltage to an initial level, where the initial level is based at least in part on an initial voltage offset value and a level between a first logic level and a second logic level of the plurality of logic levels.

Aspect 22: The system of any of aspects 18 through 21, where each of the plurality of commands indicates one or more offsets associated with the edges of the plurality of logic levels.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (e.g., "electrically coupling") may refer to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorus, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processing system (e.g., one or more processors, one or more controllers, control circuitry processing circuitry, logic circuitry), firmware, or any combination thereof. If implemented in software executed by a processing system, the functions may be stored on or transmitted over as one or more instructions (e.g., code) on a computer-readable medium. Due to the nature of software, functions described herein can be implemented using software executed by a processing system, hardware, firmware, hardwiring, or combinations of any of these. Features implementing functions may be physically located at various positions, including being distributed such that portions of functions are implemented at different physical locations.

Illustrative blocks and modules described herein may be implemented or performed with one or more processors, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or other types of processors. A processor may also be implemented as at least one of one or more computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, including in the claims, the article "a" before a noun is open-ended and understood to refer to "at least one" of those nouns or "one or more" of those nouns. Thus, the terms "a," "at least one," "one or more," "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:

one or more memory devices; and processing circuitry coupled with the one or more memory devices and configured to cause the memory system to:

receive a command associated with determining a read budget of a first edge of a first logic level of a plurality of logic levels for an array of memory cells, wherein a set of initial data is stored in a first set of memory cells of the array of memory cells using the plurality of logic levels, the plurality of logic levels being associated with one or more multi-level cell programming operations;

store a set of expected data in a second set of memory cells of the array of memory cells using a single-level cell programming operation based at least in part on receiving the command, wherein the set of expected data corresponds to the set of initial data;

perform a voltage sweep operation, wherein to perform the voltage sweep operation, the processing circuitry is configured to cause the memory system to:

set a first read voltage to a first level for reading the first set of memory cells;

read a first set of data from the first set of memory cells based at least in part on setting the first read voltage to the first level;

set the first read voltage to a second level based at least in part on a first quantity of bit values that is based at least in part on a function of the first set of data read from the first set of memory cells and the set of expected data;

read a second set of data from the first set of memory cells based at least in part on setting the first read voltage to the second level; and determine a second quantity of bit values based at least in part on a function of the second set of data read from the first set of memory cells and the set of expected data; and transmit an offset voltage, corresponding to the read budget and based at least in part on the first level and the second level, based at least in part on a difference between the second quantity of bit values and the first quantity of bit values satisfying a threshold quantity.

2. The memory system of claim 1, wherein the processing circuitry is further configured to cause the memory system to:

determine an expected bit value associated with the first edge and the first logic level of the plurality of logic levels, wherein determining the first quantity of bit values and the second quantity of bit values is based at least in part on counting respective quantities of the expected bit value within the first set of data and the second set of data.

3. The memory system of claim 2, wherein the functions comprise AND logic functions based at least in part on the expected bit value being a one, or comprise OR logic functions based at least in part on the expected bit value being a zero.

4. The memory system of claim 1, wherein, to determine the second quantity of bit values, the processing circuitry is configured to cause the memory system to:

store the set of expected data in a first set of memory cells of a buffer;

store the second set of data in a second set of memory cells of the buffer;

store a third set of data in a third set of memory cells of the buffer based at least in part on the function of the second set of data read from the first set of memory cells and the set of expected data; and count a quantity of bits in the third set of data that correspond to an expected bit value associated with the first edge and the first logic level of the plurality of logic levels, wherein the second quantity of bit values corresponds to the quantity of bits.

5. The memory system of claim 1, wherein the processing circuitry is further configured to cause the memory system to:

set a second read voltage to a third level, wherein the second read voltage is associated with a second logic level of the plurality of logic levels different from the first logic level.

6. The memory system of claim 5, wherein the processing circuitry is further configured to cause the memory system to:

set a third read voltage to a fourth level, wherein the third read voltage is associated with a third logic level of the plurality of logic levels different from the first logic level and the second logic level.

7. The memory system of claim 1, wherein a magnitude of an offset value for the second level is half of a magnitude of an initial offset value for the first level.

8. The memory system of claim 1, wherein the offset voltage is based at least in part on a difference between the second level and a level between the first logic level and a second logic level of the plurality of logic levels.

9. The memory system of claim 1, wherein the first level is based at least in part on an initial offset value and a level between the first logic level and a second logic level of the plurality of logic levels.

10. The memory system of claim 9, wherein the initial offset value is based at least in part on a width of two logic levels of the plurality of logic levels.

11. A system, comprising:

a host system coupled with a memory system comprising an array of memory cells, wherein a controller of the host system is operable to:

transmit a plurality of commands to the memory system associated with determining a plurality of read budgets corresponding to edges of a plurality of logic levels for the array of memory cells; and determine the plurality of read budgets based at least in part on a plurality of offset voltages received from the memory system, wherein the plurality of offset voltages are associated with the edges of the plurality of logic levels; and the memory system comprising the array of memory cells, wherein, for each command of the plurality of commands, the memory system is operable to:

store a set of expected data in a second set of memory cells of the array of memory cells using a single-level cell programming operation based at least in part on identifying a set of initial data in a buffer corresponding to data stored in a first set of memory cells of the array of memory cells using the plurality of logic levels;

determine an offset voltage associated with a level based at least in part on setting a read voltage to the level and determining that a difference between a quantity of bit values, associated with a function of a set of data read from the first set of memory cells and the set of expected data, and an initial quantity of bit values satisfies a threshold quantity; and transmit the offset voltage, corresponding to a read budget of the plurality of read budgets and associated with the level, to the host system based at least in part on determining that the difference between the quantity of bit values and the initial quantity of bit values satisfies the threshold quantity.

12. The system of claim 11, wherein, for each command of the plurality of commands, the memory system is further operable to:

set the read voltage to a plurality of levels comprising the level, wherein determining the offset voltage is based at least in part on determining that one or more differences of quantities of bit values, associated with one or more additional levels of the plurality of levels, and the initial quantity of bit values fail to satisfy the threshold quantity.

13. The system of claim 11, wherein, for each command of the plurality of commands, the memory system is further operable to:

determine an expected bit value associated with an edge of a logic level of the plurality of logic levels, wherein the quantity of bit values is based at least in part on counting quantities of the expected bit value within the set of data.

14. The system of claim 11, wherein, for each command of the plurality of commands, the memory system is further operable to:

set the read voltage to an initial level, wherein the initial level is based at least in part on an initial voltage offset value and a level between a first logic level and a second logic level of the plurality of logic levels.

15. The system of claim 11, wherein each of the plurality of commands indicates one or more offsets associated with the edges of the plurality of logic levels.

16. A non-transitory computer-readable medium storing code comprising instructions which, when executed by one or more processors of a memory system, cause the memory system to:

receive a command associated with determining a read budget of a first edge of a first logic level of a plurality of logic levels for an array of memory cells, wherein a set of initial data is stored in a first set of memory cells of the array of memory cells using the plurality of logic levels, the plurality of logic levels being associated with one or more multi-level cell programming operations;

store a set of expected data in a second set of memory cells of the array of memory cells using a single-level cell programming operation based at least in part on receiving the command, wherein the set of expected data corresponds to the set of initial data;

perform a voltage sweep operation, wherein the instructions to perform the voltage sweep operation, when executed by the one or more processors of the memory system, further cause the memory system to:

set a first read voltage to a first level for reading the first set of memory cells;

read a first set of data from the first set of memory cells based at least in part on setting the first read voltage to the first level;

set the first read voltage to a second level based at least in part on a first quantity of bit values that is based at least in part on a function of the first set of data read from the first set of memory cells and the set of expected data;

read a second set of data from the first set of memory cells based at least in part on setting the first read voltage to the second level; and determine a second quantity of bit values based at least in part on a function of the second set of data read from the first set of memory cells and the set of expected data; and transmit an offset voltage, corresponding to the read budget and based at least in part on the first level and the second level, based at least in part on a difference between the second quantity of bit values and the first quantity of bit values satisfying a threshold quantity.

17. The non-transitory computer-readable medium of claim 16, wherein the instructions, when executed by the one or more processors of the memory system, further cause the memory system to:

determine an expected bit value associated with the first edge and the first logic level of the plurality of logic levels, wherein determining the first quantity of bit values and the second quantity of bit values is based at least in part on counting respective quantities of the expected bit value within the first set of data and the second set of data.

18. The non-transitory computer-readable medium of claim 17, wherein the functions comprise AND logic functions based at least in part on the expected bit value being a one, or comprise OR logic functions based at least in part on the expected bit value being a zero.

19. The non-transitory computer-readable medium of claim 16, wherein the instructions to determine the second quantity of bit values, when executed by the one or more processors of the memory system, further cause the memory system to:

store the set of expected data in a first set of memory cells of a buffer;

store the second set of data in a second set of memory cells of the buffer;

store a third set of data in a third set of memory cells of the buffer based at least in part on the function of the second set of data read from the first set of memory cells and the set of expected data; and count a quantity of bits in the third set of data that correspond to an expected bit value associated with the first edge and the first logic level of the plurality of logic levels, wherein the second quantity of bit values corresponds to the quantity of bits.

20. The non-transitory computer-readable medium of claim 16, wherein the instructions, when executed by the one or more processors of the memory system, further cause the memory system to:

set a second read voltage to a third level, wherein the second read voltage is associated with a second logic level of the plurality of logic levels different from the first logic level.

* * * * *